(12) United States Patent
Albert et al.

(10) Patent No.: US 11,300,778 B2
(45) Date of Patent: Apr. 12, 2022

(54) MEMS DEVICE WITH SUSPENSION STRUCTURE AND METHOD OF MAKING A MEMS DEVICE

(71) Applicant: Infineon Technologies AG, Neubiberg (DE)

(72) Inventors: Stephan Gerhard Albert, Munich (DE); Franz Michael Darrer, Graz (AT); Marcus Edward Hennecke, Graz (AT); Hendrikus Van Lierop, Bj Weert (NL)

(73) Assignee: Infineon Technologies AG

( * ) Notice: Subject to any disclaimer, the term of this patent is extended or adjusted under 35 U.S.C. 154(b) by 276 days.

(21) Appl. No.: 16/415,104

(22) Filed: May 17, 2019

(65) Prior Publication Data

US 2019/0361223 A1 Nov. 28, 2019

(30) Foreign Application Priority Data

May 22, 2018 (DE) .......................... 102018208022.4
Sep. 27, 2018 (DE) .......................... 102018216611.0

(51) Int. Cl.
*G02B 26/08* (2006.01)
*B81C 1/00* (2006.01)
*B81B 3/00* (2006.01)

(52) U.S. Cl.
CPC .......... *G02B 26/0833* (2013.01); *B81B 3/007* (2013.01); *B81B 3/0072* (2013.01); *B81C 1/00182* (2013.01); *B81C 1/00658* (2013.01); *B81C 1/00666* (2013.01); *B81B 2201/042* (2013.01)

(58) Field of Classification Search
None
See application file for complete search history.

(56) References Cited

U.S. PATENT DOCUMENTS

| 2005/0035682 | A1* | 2/2005 | Tsuboi | H02N 1/008 310/309 |
| 2005/0219674 | A1 | 10/2005 | Asai et al. | |
| 2005/0219677 | A1 | 10/2005 | Krylov et al. | |
| 2007/0171496 | A1* | 7/2007 | Jeong | H04N 5/7458 359/224.1 |
| 2008/0054758 | A1 | 3/2008 | Tsuboi et al. | |
| 2013/0213134 | A1* | 8/2013 | Mao | G01C 19/574 73/504.14 |
| 2014/0327946 | A1 | 11/2014 | van Lierop et al. | |
| 2019/0129163 | A1* | 5/2019 | Van Lierop | F16F 1/185 |

FOREIGN PATENT DOCUMENTS

DE  102007001516 B3  4/2008
DE  102008049647 A1  4/2010

* cited by examiner

*Primary Examiner* — Jennifer D. Carruth
(74) *Attorney, Agent, or Firm* — Design IP

(57) ABSTRACT

A MEMS device includes a body pivoting around a pivot axis, a support, and a suspension structure mechanically coupling the body to the support. The suspension structure includes a torsion element defining the pivot axis, and first and second spring elements extending with an angle relative to the pivot axis on opposing sides of the torsion element so that a distance between at least portions of the first and second spring elements is changing in the direction of the pivot axis. The extension of the first and second spring elements in the direction of the pivot axis is larger than the extension of the torsion element in the direction of the pivot axis.

23 Claims, 21 Drawing Sheets

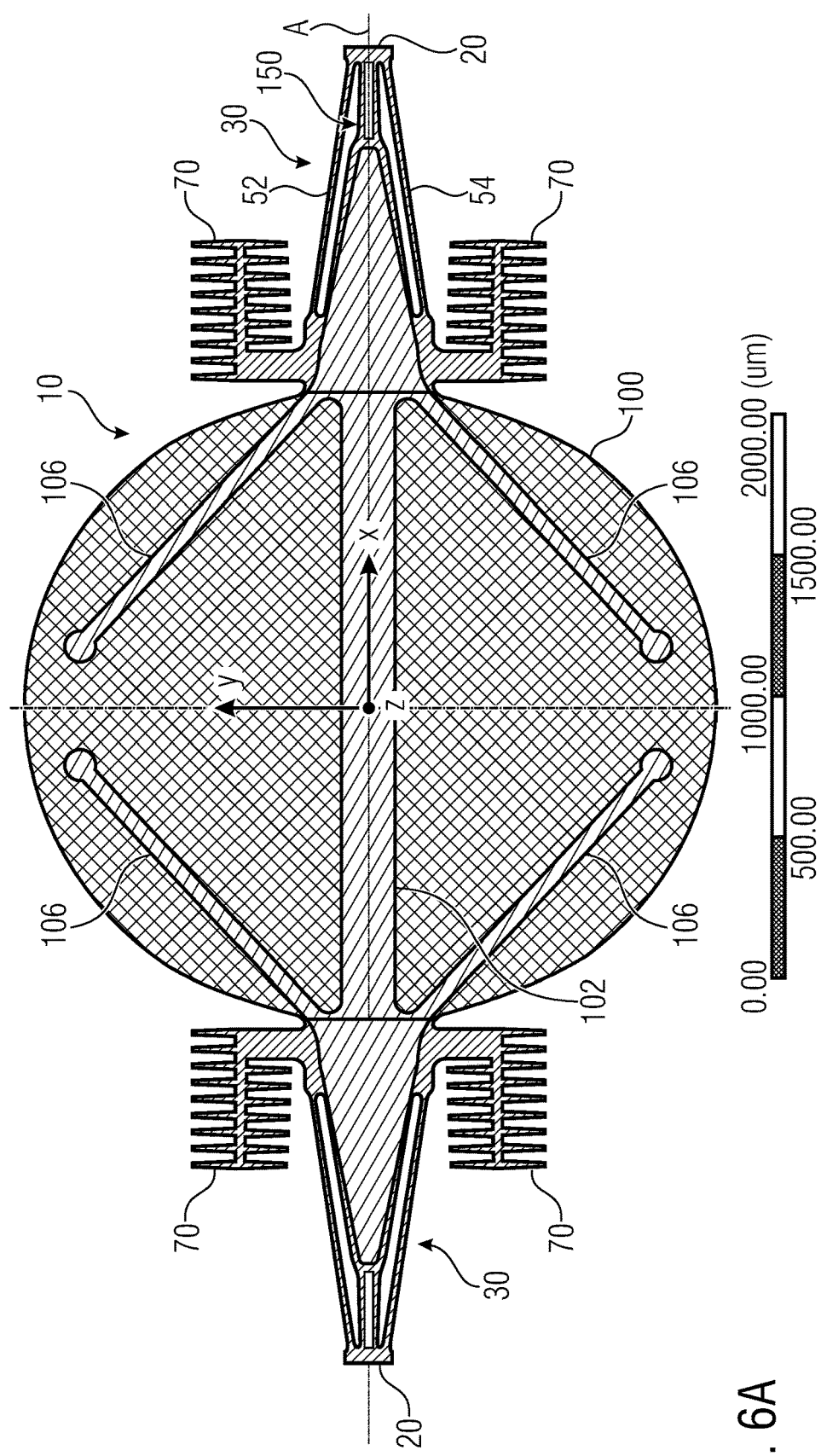
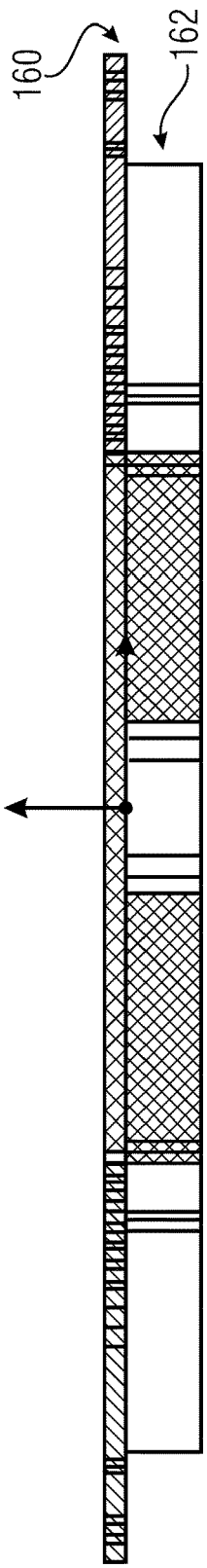
Fig. 6A
Fig. 6B

200

Forming in a substrate a body pivoting around a pivot axis, a support and a suspension structure mechanically coupling the body to the support Forming a torsion element defining the pivot axis, and first and second spring elements extending with an angle relative to the pivot axis on opposing sides of the torsion element so that a distance between at least portions of the first and second spring elements is changing in the direction of the pivot axis, wherein the extension of the first and second spring elements in the direction of the pivot axis is larger than the extension of the torsion element in the pivot axis

Forming in a substrate a body pivoting around a pivot axis, a support and a suspension structure mechanically coupling the body to the support Forming a torsion element defining the pivot axis, and first and second spring elements extending with an angle relative to the pivot axis on opposing sides of the torsion element so that a distance between at least portions of the first and second spring elements is changing in the direction of the pivot axis

212

Forming relief link mechanically coupling at least the first and second spring elements to the support, wherein the relief link is configured to allow for a translation of the first and second spring elements in the direction of the pivot axis at their ends adjacent to the relief link

Forming in a substrate a body pivoting around a pivot axis, a support and a suspension structure mechanically coupling the body to the support Forming a torsion element defining the pivot axis, and first and second spring elements extending with an angle relative to the pivot axis on opposing sides of the torsion element so that a distance between at least portions of the first and second spring elements is changing in the direction of the pivot axis, wherein the torsion element and the first and second spring elements are formed in the same material layer or in the same material layers of a material layer stack

MEMS DEVICE WITH SUSPENSION STRUCTURE AND METHOD OF MAKING A MEMS DEVICE

FIELD

The present disclosure relates to Micro Electro Mechanical System (MEMS) devices comprising a body mechanically coupled to a support via a suspension structure to pivot around a pivot axis, and to methods for making corresponding MEMS devices.

BACKGROUND

Micro Electro Mechanical System (MEMS)devices, such as MEMS scanning mirrors, are used in different fields. MEMS devices may comprise a body, such as a mirror body, pivoting about at least one pivot axis in order to achieve a desired effect, such as to reflect electromagnetic energy, visible or invisible light, for example, into different directions. For example, MEMS scanning mirrors may be used in projecting two-dimensional images onto a screen. MEMS scanning mirrors may also be used in LIDAR applications. LIDAR may be regarded as representing an abbreviation for Light Imaging, Detection, And Ranging or as an artificial word composed of the terms light and radar. Generally, LIDAR may be regarded as a surveying method that measures the distance to a target by illuminating the target with pulsed laser light and measuring the reflected pulses with a sensor. MEMS scanning mirrors may be used for LIDAR in automotive applications. Generally, MEMS scanning mirrors for LIDAR applications may comprise relatively large dimensions and large scan angles for a high optical performance. In addition, such MEMS scanning mirrors should have a high robustness, i.e. should be insensitive to vibrations and thermal loads, and should develop low mechanical stresses. It is challenging to find a design and manufacturing process that meet these goals.

In order to make a MEMS scanning mirror robust against vibrations, the mirror should have a low inertia, i.e., a light and stiff mirror body. In addition, the mirror should have a high stiffness of its suspension for all degrees-of-freedom (DOF) of the mirror body except for the desired oscillating mode(s). In order to achieve a light and stiff mirror body, the mirror body may comprise a relatively thin mirror and a thicker reinforcement structure for the mirror. The mirror body may be mechanically coupled to a support, such as a mirror frame, to be rotatable around a pivot axis, i.e. rotation axis. The pivot axis may extend to first and second mutually opposite end-portions of the mirror body. The mirror may have a reflective plane on a first main surface and opposite the first main surface a second main surface provided with the reinforcement structure.

One kind of such MEMS devices is operated in resonance of one rotational degree of freedom (DOF) around the pivot axis. For example, the x-axis may be regarded as the pivot axis, i.e. Rx represents the rotation around the x-axis. Such MEMS devices may be excited with an electrostatic comb drive. Additionally to the desired DOF, e.g. Rx, the pivoting body of a MEMS device, such as a MEMS scanner, may have other mechanical degrees of freedom and associated unwanted eigenmodes: Tx, Ty, Tz, Ry, Rz, i.e. translations in x-, y-, and z-direction and rotations around the y- and z-axis. For a robust design, it is generally desired to suppress these unwanted modes, which can be regarded as being equivalent to pushing them to high (eigen-)frequencies by means of a suitable design.

SUMMARY

Examples of the present disclosure provide a MEMS device including a body pivoting around a pivot axis, a support and a suspension structure mechanically coupling the body to the support. The suspension structure includes a torsion element defining the pivot axis, and first and second spring elements extending with an angle relative to the pivot axis on opposing sides of the torsion element so that a distance between at least portions of the first and second spring elements is changing in the direction of the pivot axis. The extension of the first and second spring elements in the direction of the pivot axis is larger than the extension of the torsion element in the direction of the pivot axis.

Examples of the present disclosure provide a MEMS device including a body pivoting around a pivot axis, a support, and a suspension structure mechanically coupling the body to the support. The suspension structure includes a torsion element defining the pivot axis, and first and second spring elements extending with an angle relative to the pivot axis on opposing sides of the torsion element so that a distance between at least portions of the first and second spring elements is changing in the direction of the pivot axis. The suspension structure includes a relief link mechanically coupling at least the first and second spring elements or the torsion element to the support, wherein the relief link is configured to allow for a translation of the first and second spring elements or the torsion element in the direction of the pivot axis at their ends adjacent to the relief link.

Examples of the present disclosure provide a MEMS device including a body pivoting around a pivot axis, a support, and a suspension structure mechanically coupling the body to the support. The suspension structure includes a torsion element defining the pivot axis, and first and second spring elements extending with an angle relative to the pivot axis on opposing sides of the torsion element so that a distance between at least portions of the first and second spring elements is changing in the direction of the pivot axis. The torsion element and the first and second spring elements are formed in the same material layer or in the same material layers of a material layer stack.

Examples of the present disclosure permit MEMS devices which permit a mode separation between a desired mode of oscillation and undesired modes of oscillation and which may be manufactured in an easy manner. According to examples of the present disclosure, similar mode separation as in a leaf spring design may be achieved by using a specific suspension structure. Examples of the present disclosure permit the torsion bar and the spring elements of the suspension structure to be formed in the same material layer or in the same material layers of a stack of material layers.

Examples of the present disclosure provide methods for manufacturing such MEMS devices.

BRIEF DESCRIPTION OF THE DRAWINGS

Examples of the disclosure will be described using the accompanying drawings, in which:

FIG. 3 shows an example of a suspension structure, in which a pivoting body comprises a protrusion which a torsion beam is mechanically coupled to;

FIG. 4 shows an example of a suspension structure, in which a support comprises a protrusion which a torsion beam is mechanically coupled to;

FIGS. 6A and 6B show a bottom view and a cross-sectional view of a MEMS mirror device according to an example of the present disclosure;

FIGS. 16A to 16C show flow charts of methods for manufacturing a MEMS device according to examples of the present disclosure.

DETAILED DESCRIPTION

Figure 1:
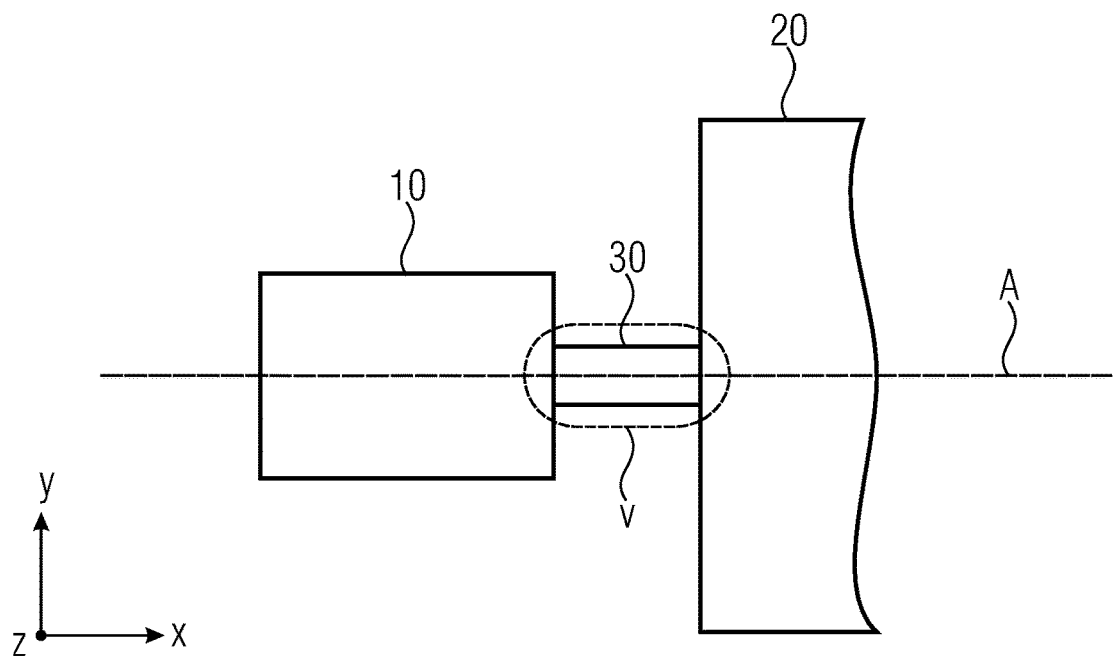
FIG. 1 shows a schematic top view of an example of a MEMS device comprising a suspension structure.

In the following, examples of the present disclosure will be described in detail using the accompanying drawings. It is to be pointed out that the same elements or elements having the same functionality are provided with the same or similar reference numbers and that a repeated description of elements provided with the same or similar reference numbers is typically omitted. Hence, descriptions provided for elements having the same or similar reference numbers are mutually exchangeable. In the following description, a plurality of details is set forth to provide a more thorough explanation of examples of the disclosure. However, it will be apparent to one skilled in the art that other examples may be practiced without these specific details. In other instances, well-known structures and devices are shown in block diagram form rather in detail in order to avoid obscuring examples of the present disclosure. In addition, features of the different examples of the present disclosure may be combined with each other, unless specifically noted otherwise.

Considering a MEMS mirror device having a mirror body supported by two torsion bars at two opposite ends thereof. The torsion bars extend in the direction of the pivot axis and, thus, define the pivot axis. The torsion bars also act as bending beams for the Ty and Tz mode, as well as the modes Rz and Ry. Ty and Tz could be suppressed by decreasing the length L of the torsion bars because of the different scaling of the bending and torsional stiffness with the length L. The torsional stiffness scales with 1/L while the bending stiffness scales with $1/L^3$. However, since there are upper constraints to the mechanical stress in the torsion bars at a certain tilt angle, the torsion bars cannot be shortened arbitrarily. In practice, if one imposes an upper limit of e.g. 1.1 GPa of stress, the torsion bars will have a length, at which Ty and Tz are very close to Rx, which is unfavorable for robustness.

In order to achieve a high stiffness suspension and to suppress modes of different DOFs, the mirror body may be supported in the mirror frame using the torsion bars as support beams and additional leaf springs extending perpendicular to the pivot axis. The torsion bars may be formed by narrow torsions bars having a low width in a direction parallel to a substrate plane and perpendicular to the rotation axis, to reduce the stiffness with respect to Rx. Such narrow torsion bars defining the axis of rotation may suppress the modes Tz and Ry. In the leaf spring principle, a restoring torque is mainly provided by the leaf springs. The leaf springs perform a bending motion when the device pivots around the pivot axis, x-axis. The leaf springs allow the structure to be stiff with respect to Rz and Ty. However, the leaf springs alone would render the stiffening curve, i.e. the restoring torque versus the rotation angle, highly nonlinear resulting in unfavorable stress conditions. Also, the maximum achievable rotation angle would be limited due to the increasing stiffness. For this reason, relief springs are generally used to couple the ends of the leaf springs distant from the mirror body to the mirror frame. Providing the relief springs makes the structure softer again with respect to Ty and Rz, which is unfavorable considering mode separation demands. Hence, the exact stiffness of the relief springs represents a design compromise between mode separation requirements and the necessary reduction of nonlinearity.

Generally, the rationale of the leaf spring design may be to push the undesired rotational and translational modes to higher frequencies. In order to avoid a too high stiffness with respect to the desired mode (rotation about the pivot axis), the thickness of the leaf springs in a direction perpendicular to the plane defined by the mirror frame is smaller than the thickness of the support beams. Thus, a quite thin layer is to be provided to form the leaf springs because their stiffness scales with $t^3$, wherein t is the thickness perpendicular to the substrate plane, i.e. the mirror plane. In general, the mirror structure, the torsion bars and the leaf springs cannot be formed in the same layer because of the different thickness requirements. Forming the mirror body in the same layer as the leaf spring, without any additional stiffening means, would make the mirror body too soft resulting in very large dynamic deformations. Also, the torsion bars cannot be formed in the same layer as the leaf springs because the mode suppression of Tz and Ry relies on their thickness being higher than the thickness of the leaf springs. Furthermore, for a capacitive (electrostatic) actuation of the mirror body with comb drives, the driving capacitance and thus the energy, which can be injected in the mechanical oscillator per cycle, and, thus, the maximally achievable rotation angle, scale with the thickness of the comb drive. To achieve a suitable driving capacitance, a significantly larger thickness of the comb drive(s) compared to the leaf springs is generally required. Hence, the leaf spring design requires the formation of different layers for the leaf springs on the one hand and for other structures such as the comb drive, the narrow torsion bars, and the stiffening structure of the mirror body on the other hand. This makes the fabrication more difficult since in general more process steps are necessary. Also, attaching the thin leaf springs to the mirror body results in reentrant corners with stress singularities compromising reliability.

FIG. 1 shows an example of a MEMS device comprising a body 10 pivoting around a pivot axis A, a support 20, and a suspension structure 30 mechanically coupling the body 10 to the support 20. Sometimes, the pivot axis is called axis of rotation.

Generally, the MEMS device may be formed in a substrate. A substrate plane may be defined to be parallel to at least one main surface of the substrate or to two opposing main surfaces of the substrate. The main surfaces of the substrate are the surfaces defined by the surfaces having larger areas than surfaces connecting the main surfaces. Generally, in a three-dimensional coordinate system, a x direction and a y direction may be in the substrate plane and a z direction may be perpendicular to the substrate plane. The pivot axis may be parallel to the substrate plane. In case of a MEMS mirror device, a mirror plane of a mirror of the MEMS mirror device may be parallel to the substrate plane in a non-deflected state of the mirror.

Figure 2:
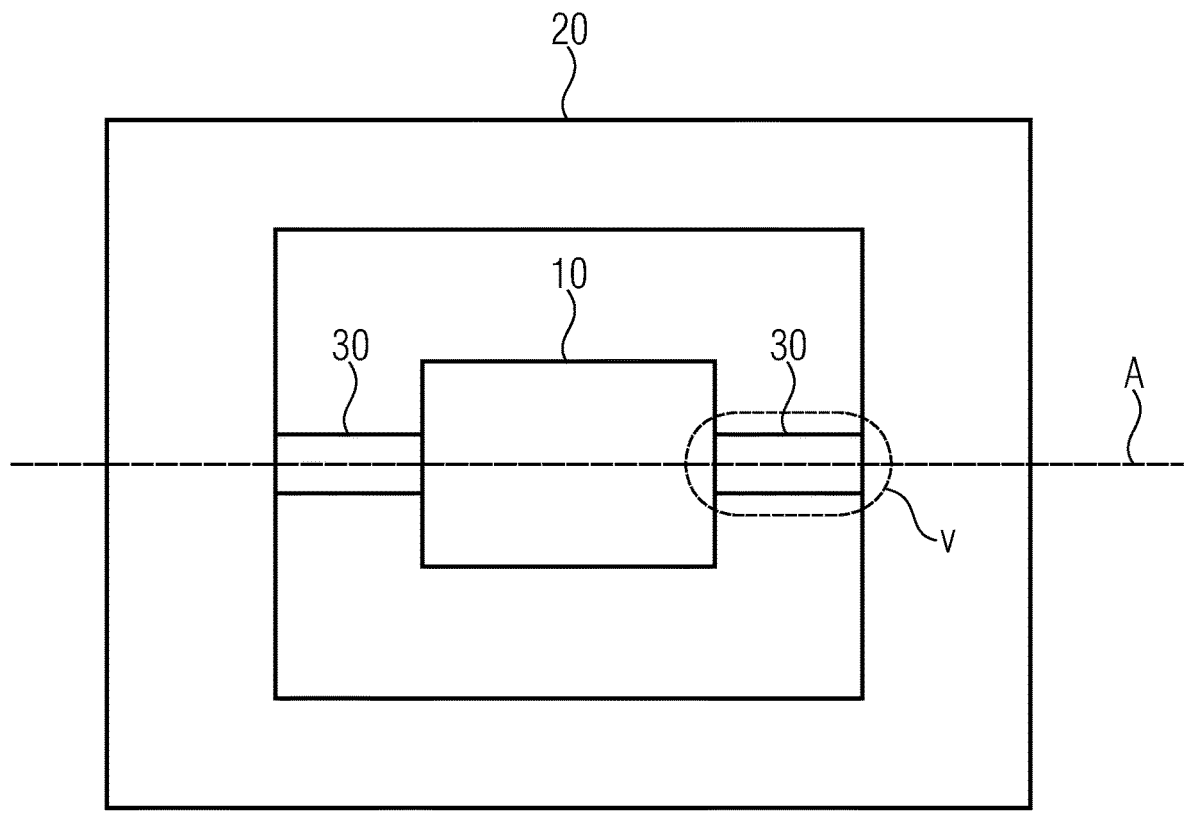
FIG. 2 shows a schematic top view of an example of a MEMS device comprising two suspension structures at two opposite ends of a body.

The MEMS device may comprise a single suspension structure 30 mechanically coupling one portion of the pivoting body 10 to the support 20, as shown in FIG. 1. In examples, the MEMS device may comprise a plurality of suspension structures mechanically coupling different portions of the pivoting body to the support. FIG. 2 shows an example, in which two opposite ends of pivoting body 10 are mechanically coupled to support 20 via suspension structures 30. Support 20 may comprise a frame as shown in FIG. 2. The suspension structures 30 on both sides of body 10 may be symmetrical with respect to a symmetry plane perpendicular to pivot axis A.

In operation of the MEMS device, pivoting body 10 is driven to oscillate about pivot axis A. A drive, such as a comb drive, may be provided to drive body 10. The drive may comprise first drive structures, such as first comb electrodes, on pivoting body 10 and second drive structures, such as comb electrodes, on support 20. Driving signals may be applied to the drive in order to make pivoting body 10 oscillate about pivot axis A.

Figure 3:
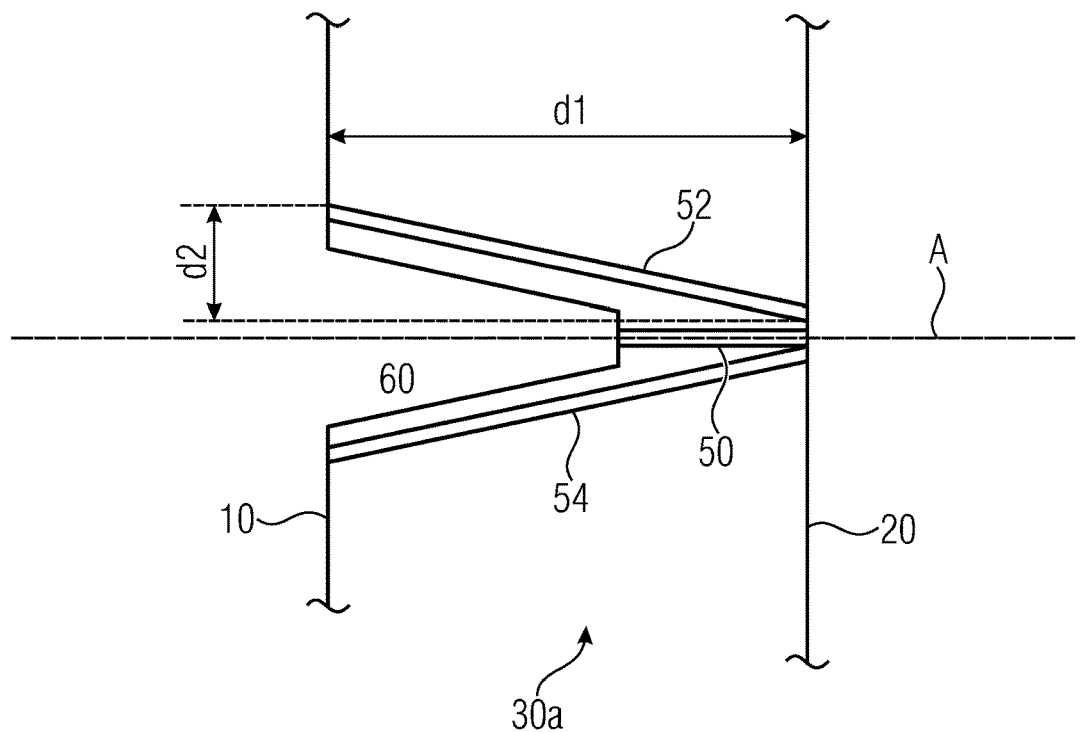
Figure 4:
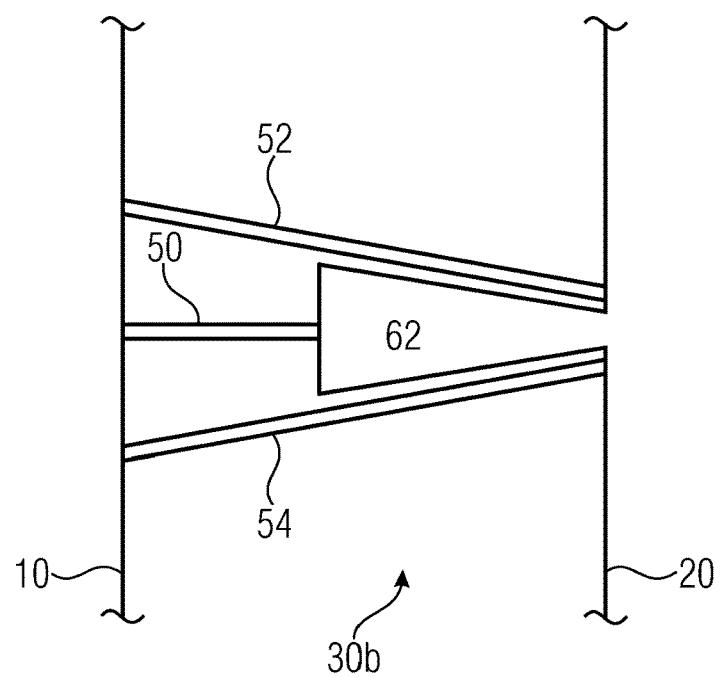

FIGS. 3 and 4 show examples of suspension structures and may be regarded as representing magnifications of regions V in FIGS. 1 and 2.

An example of a suspension structure 30a according to the present disclosure is shown in FIG. 3. Suspension structure 30a comprises a torsion element 50, a first spring element 52 and a second spring element 54. A first end of each spring element 52, 54 is mechanically coupled to the body 10 and a second end of each spring element 52, 54 is mechanically coupled to support 20. A first end of torsion bar 50 is mechanically coupled to a protrusion 60 of body 10. Protrusion 60 protrudes from body 10 towards support 20. A second end of torsion bar 50 is mechanically coupled to support 20. The shape of protrusion 60 may be adapted to the configuration of the spring elements 52, 54. Protrusion 60 may have a shape changing in the direction of the pivot axis for exampling a shape narrowing in the direction of the pivot axis. In some examples, protrusion 60 may have a shape with at least one surface substantially parallel to the extension of one spring element of the spring elements 52, 54. For example protrusion 60 may be a trapezoid as shown. Protrusion 60 may allow that the torsion bar 50 can be shortened. It is to be noted that protrusion 60 is much more massive than torsion bar 50 since protrusion 60 has an extension in the direction perpendicular to the pivot axis significantly larger than torsion bar 50. Thus, protrusion 60 is substantially torsion-free compared to torsion bar 50.

The torsion element or the torsion elements define the pivot axis. In examples, torsion element 50 comprises an elongate torsion bar. In examples, torsion element 50 comprises a plurality of elongate torsion bars, which may extend in parallel to each other. In examples, the torsion bar or the torsion bars may be collinear with the pivot axis A. In examples, the torsion element extends substantially in the direction of the pivot axis. With the torsion element extending substantially in the direction of the pivot axis the direction of the largest dimension of the torsion element is mainly in the direction of the pivot axis, i.e. that an angle between the direction of the largest dimension of the torsion element and the pivot axis is up to 45° but not more. In examples, the angle may be significantly less than 45°, for example at most 10° or at most 2°. Parallel torsion elements or torsion elements with a small angle allow to avoid or reduce out of plane bending for RX. In examples, the torsion element may comprise torsion bars in a V-arrangement such that an angle between the direction of the largest dimension of each torsion bar and the pivot axis is less than 45°. In such examples, the pivot axis may be defined by the bisecting line between the torsion bars. In examples, the V-shape of such a V-arrangement of a torsion element may open towards a direction opposite to the direction in which a V-shape of the first and second spring elements opens.

The first and second spring elements 52 and 54 extend with an angle relative to the pivot axis A on opposite sides of torsion element 50 so that a distance between them changes in the direction of pivot axis A. In the example shown, a distance between portions of the first and second spring elements 52 and 54 closer to body 10 is larger than a distance between portions of the first and second spring elements 52, 54 closer to support 20. In the example shown, the first and second spring elements 52 and 54 comprise straight spring bars arranged in a V shape. In examples, the spring elements may comprise spring bars having first and second portions, wherein the first portions extend in parallel to each other and the second portions extend such that the distance therebetween is changing in the direction of the pivot axis. In such examples, the spring bars may by arranged in a Y shape.

A first extension d1 of the spring elements 52, 54 in the direction of the pivot axis may be larger than a second extension d2 of the spring elements 52, 54 in a direction perpendicular to the pivot axis. In examples, the spring elements 52, 54 or at least portions thereof, are bar shaped and an angle between the longitudinal direction of the bar shaped spring elements or the bar shaped portions of the spring elements may be in the order of 5° to 30° or in the order of 5° to 25°. In examples, the angle may be in the order of 10° to 20°. Thus, in examples, an angle between at least bar shaped portions of the first and second spring elements may be in the order of 10° to 60° or in the order of 10° to 50°, and, in examples, an angle between at least portions of the first and second spring elements may be in the order of 20° to 40°.

The extension of the first and second spring elements 52 and 54 in the direction of the pivot axis A is larger than the extension of the torsion element 50 in the direction of the pivot axis. The extension of a respective element in the direction of the pivot axis is the projection of the respective element onto the pivot axis A, i.e. the length element times the cosine of the angle between the element and the pivot axis.

FIG. 4 shows another example of a suspension structure 30b, in which support 20 comprises a protrusion 62 which the second end of torsion bar 50 is mechanically coupled to. Protrusion 62 extends from support 20 towards body 10. The shape of protrusion 62 may be adapted to the configuration of spring elements 52, 54 and may be trapezoid as shown in FIG. 4.

The first and second ends of the torsion element 50 and the first and second ends of the spring elements 52, 54 may be fixed to body 10 and support 20, respectively. In examples, the suspension structure may comprise a relief link mechanically coupling the second ends of the first and second spring elements or the second end of the torsion element or the second ends of the first and second spring elements and of the torsion element to the support. The relief link may be configured to allow for a translation of at least the first and second spring elements or the second end of the torsion element in the direction of the pivot axis at their ends adjacent to the relief link. In such examples, the extension of the first and second spring elements in the direction of the pivot axis need not be larger than that of the torsion element in the direction of the pivot axis.

In examples, at least the torsion element and the first and second spring elements are formed in the same material layer or in the same material layers of a material layer stack. Accordingly, examples may be manufactured in an easy manner. In such examples, the extension of the first and second spring elements in the direction of the pivot axis need not be larger than that of the torsion element in the direction of the pivot axis.

In examples, the MEMS device comprises a drive and a drive structure of the body is formed in the same material layer or the same material layers of a material layer stack as the torsion element and the first and second spring elements. In examples, the MEMS device is a MEMS mirror device and a mirror of the MEMS mirror device is formed in the same material layer or the same material layers of a material layer stack as the torsion element and the first and second spring elements. In examples, the MEMS mirror device comprises a stiffening structure stiffening the mirror and a protrusion which the torsion element is mechanically coupled to.

In examples, the suspension structure or the suspension structures are formed symmetrically with respect to the pivot axis in order to improve the oscillating behavior of the pivotable body. In examples, the torsion element is formed by a torsion bar. In examples, the torsion element is formed by a plurality of torsion bars, which may extend in parallel to each other. In examples, the first and second spring elements may be formed by a spring bar. In examples, the first spring element may comprise a plurality of spring bars which may extend in parallel to each other. In examples, the second spring element may comprise a plurality of spring bars, which may extend in parallel to each other.

In examples, a minimum width of a torsion bar or of torsion bars of the torsion element is less than a minimum width of spring bars of the first and second spring element.

Generally, as used herein, the term "bar" may refer to an elongate element having a length in the longitudinal direction, a width perpendicular to the longitudinal direction, and a thickness perpendicular to the longitudinal direction and to the width direction. Generally, in the present description, the length direction and the width direction may be parallel to the substrate plane and the thickness direction may be perpendicular to the substrate plane.

In examples, the body and the suspension structure are designed such that any translation oscillations and rotary oscillations about axes perpendicular to the pivot axis comprise resonant frequencies which are different from harmonic frequencies of the resonant frequency of the rotary oscillation around the pivot axis. The translation DOF Tx becomes relevant in examples in which the suspension structure comprises a relief link. In examples without relief links, the structure will be stiff with respect to translation oscillations Tx, i.e. such oscillations are shifted to very high frequencies.

Examples of the present disclosure will now be described referring to MEMS mirror devices. It should be understood that other examples may relate to other MEMS devices comprising a body pivoting about a pivot axis. In examples, the body may be pivoting in order to act on a fluid, such as to achieve a fan effect, or to open and close a fluid path.

Examples described herein achieve similar mode separation as in a leaf spring design, but without using leaf springs so that one thickness may be used for all springs, the mirror, and the comb drive. One additional reinforcement layer for implementing a thick mirror stiffening structure may be used. The mode separation may be realized by the combination of V springs and short narrow torsion bars. The term V spring is used herein to refer to a spring structure having at least two spring elements which are arranged such that at least portions thereof form the two strokes of the letter V.

Figure 5A:
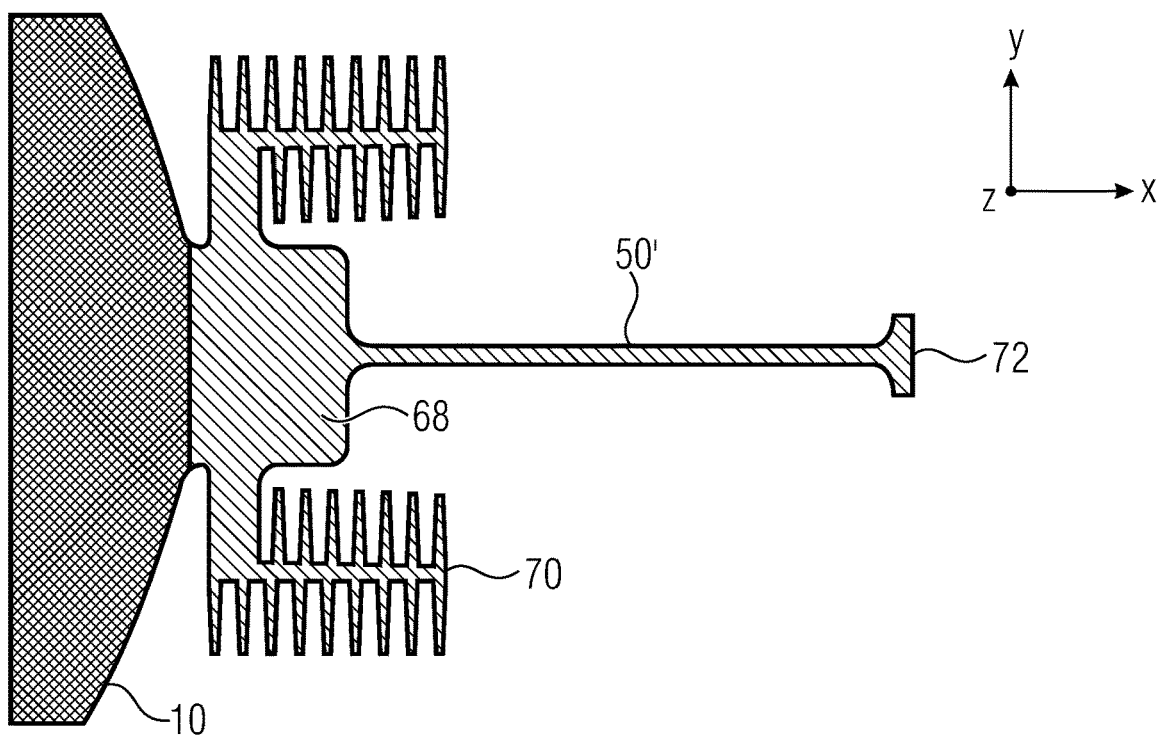
FIGS. 5A to 5C show schematic bottom views of a suspension structure comprising a torsion bar, a suspension structure comprising V springs and a suspension structure comprising a combination of a torsion bar and V springs.

FIG. 5A shows a suspension structure comprising a simple constructed torsion bar 50'. Torsion bar 50' is fixed at a first end thereof to a coupling portion 68 of mirror body 10. Mirror body 10 comprises a comb drive structure 70. A second end of torsion bar 50' represents an anchor 72, which is fixed to a support. In the suspension structure comprising a simple constructed torsion bar all other modes compete with the Rx mode, especially the Ty and Tz modes, as the torsion bar acts as a bending beam for Ty and Tz. Thus, this structure results in a poor mode separation.

Figure 5B:
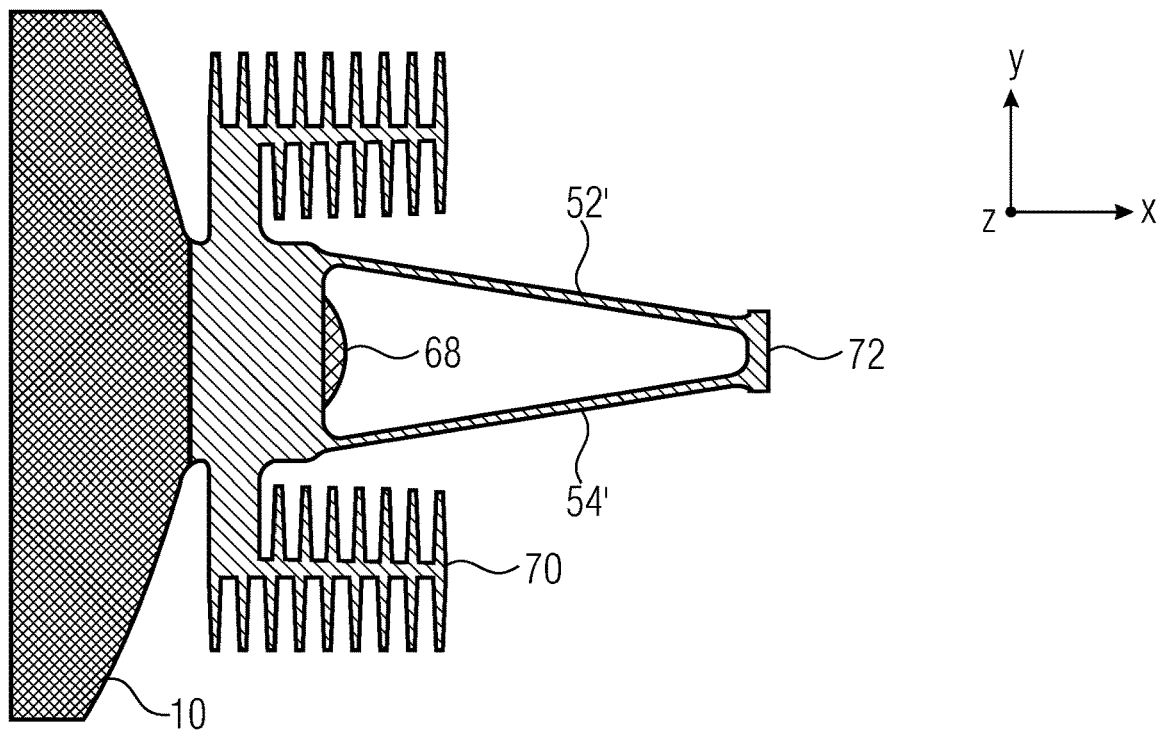

FIG. 5B shows a suspension structure comprising a V spring design. First and second spring bars 52' and 54' extend in an angle relative to the pivot axis (x axis) so that the distance between the spring bars at first ends thereof is different from the distance between the spring bars at second ends thereof. The first ends of the spring bars 52', 54' are fixed to a coupling portion of mirror body 10 and the second ends of the spring bars 52', 54' are fixed to a support via an anchor 72. The V springs have the effect of suppressing the Ty mode and the Rz mode. However, the V springs may not suppress the Tz mode and the Ry mode.

Figure 5C:
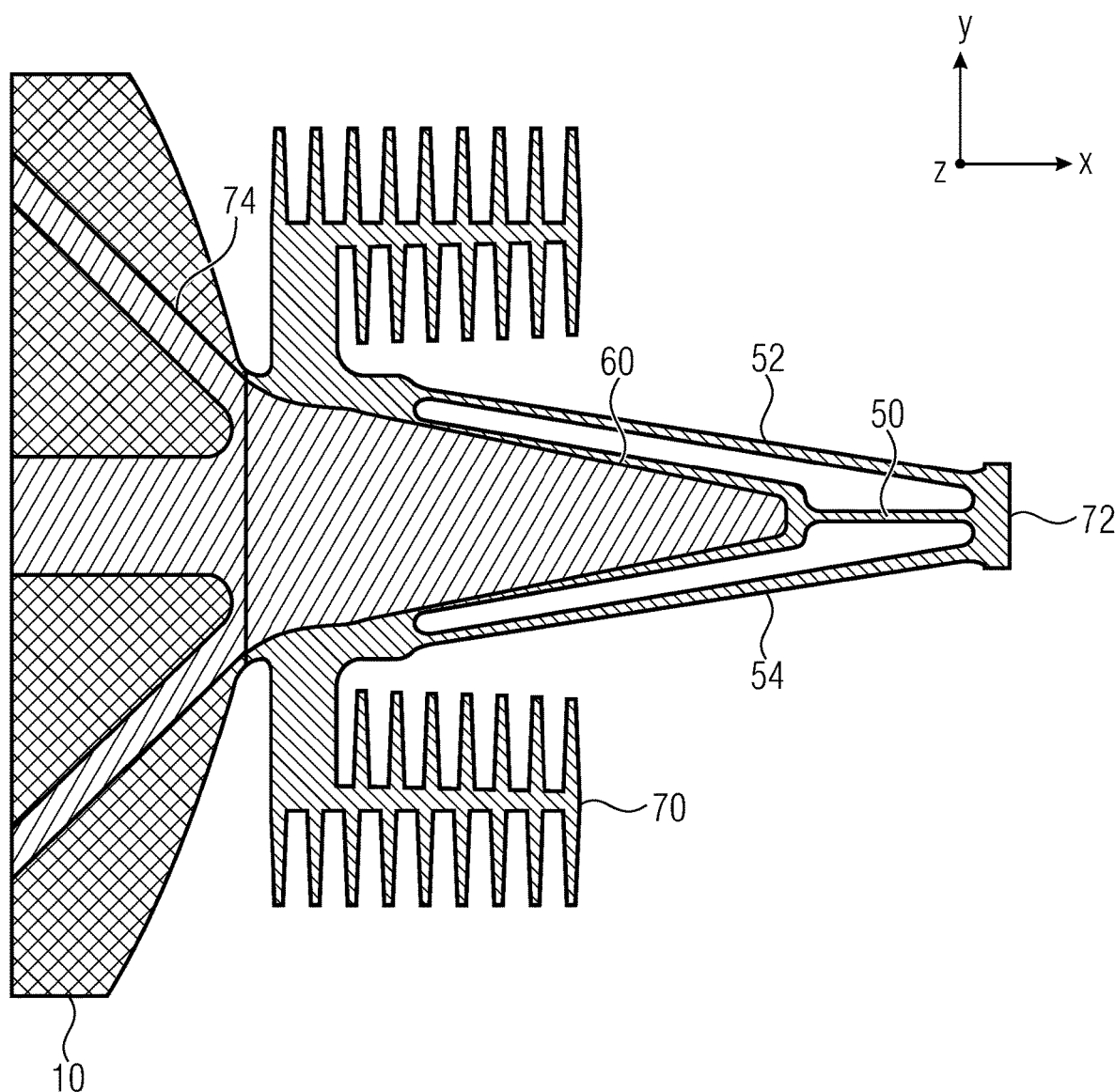

Examples of the present disclosure combine V springs and a short narrow torsion bar to suppress all modes Ty, Rz, Tz, and Ry. The result of such a combination is shown in FIG. 5C and comprises a short torsion bar 50 and first and second V spring bars 52, 54. A first end of torsion bar 50 is fixed to coupling protrusion 60 of body 10 and a second end of torsion bar 50 is fixed to a support, such as via anchor 72. First ends of spring bars 52, 54 are fixed to body 10 and second ends of spring bars 52, 54 are fixed to the support, such as via anchor 72. As shown in FIG. 5C, the second ends of torsion bar 50 and spring bars 52, 54 may be coupled by anchor 72. A stiffening structure 74 of body 10 is also indicated in FIG. 5C. In examples of the present disclosure, torsion bar 50 is short and narrow, i.e. shorter than the V springs in the direction of the pivot axis and narrower than the V springs. In examples, the thickness of torsion bar 50 is the same as the thickness of the springs bars 52, 54. FIG. 5C shows a single suspension structure at one end of body 10. Generally, in examples, a pair of corresponding suspension structures, one at each side of the body, will be provided.

Using such a combination of a V spring and a torsion bar, modes Ty and Rz may be suppressed because the V spring is not only stressed by a bending component, but also by a tensile component for these modes. The V spring is very stiff with respect to the tensile load component.

The suppression of Tz and Ry by the narrow short torsion bar(s) is due to the fact that for these modes the torsion bars act as bending beams. Because of their short length L (stiffness $\sim 1/L^3$) and large z-direction thickness t (e.g. 55 μm, stiffness $\sim t^3$), they are very stiff for out-of-plane bending. In contrast, for the desired Rx mode, the torsion bars are very soft since the width thereof is substantially less than the thickness thereof, such as at least 10 times less than the thickness thereof. The low in-plane-width (e.g. 4 μm) of the torsion bars reduces their torsional spring constant. This is because for a torsion bar with high aspect ratio of the cross-sectional rectangle, the long side t (thickness) of the cross-sectional rectangle enters substantially linearly in the stiffness, i.e. ~t, but the short side w (width) enters substantially cubically, i.e. ~$w^3$. Furthermore, the length enters as 1/L in the rotational stiffness. For this reason, shortening a torsion bar adds much more stiffness to the modes Tz and Ry than it adds rotational stiffness to Rx.

Thus, in examples of the present disclosure, reducing the length of the torsion bar when compared to the length of the V springs helps increasing the mode separation.

In examples of the present disclosure, adjusting the form of protrusion 60 may be used to adjust the mass of the pivoting body. This may be utilized to shift resonant frequencies of unwanted disturbing oscillation modes to not overlap with harmonics of the resonant frequency of the wanted mode.

Figure 7A:
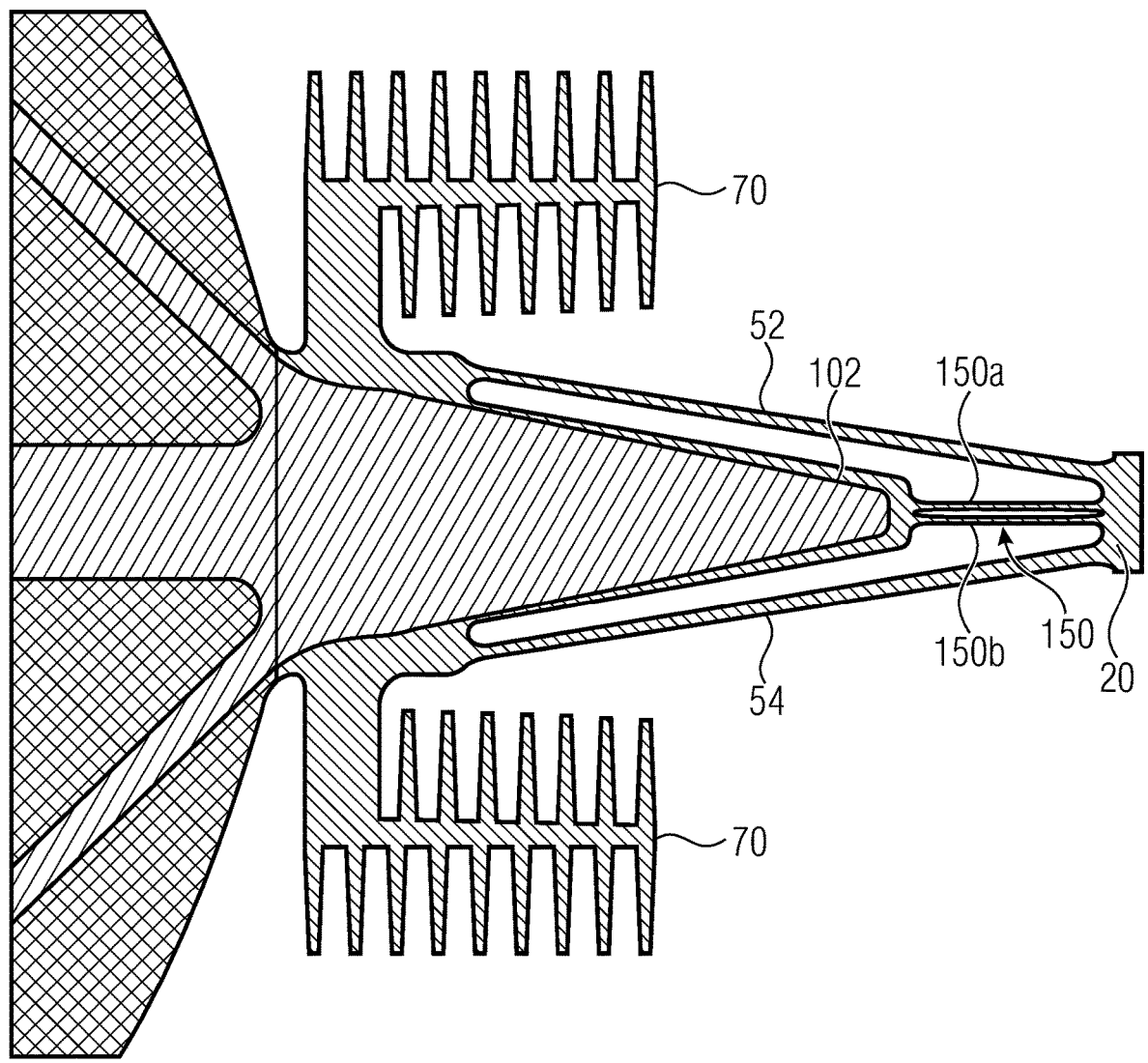
FIGS. 7A and 7B show a bottom view and a perspective view of a suspension structure of the MEMS mirror device of FIGS. 6A and 6B.
Figure 7B:
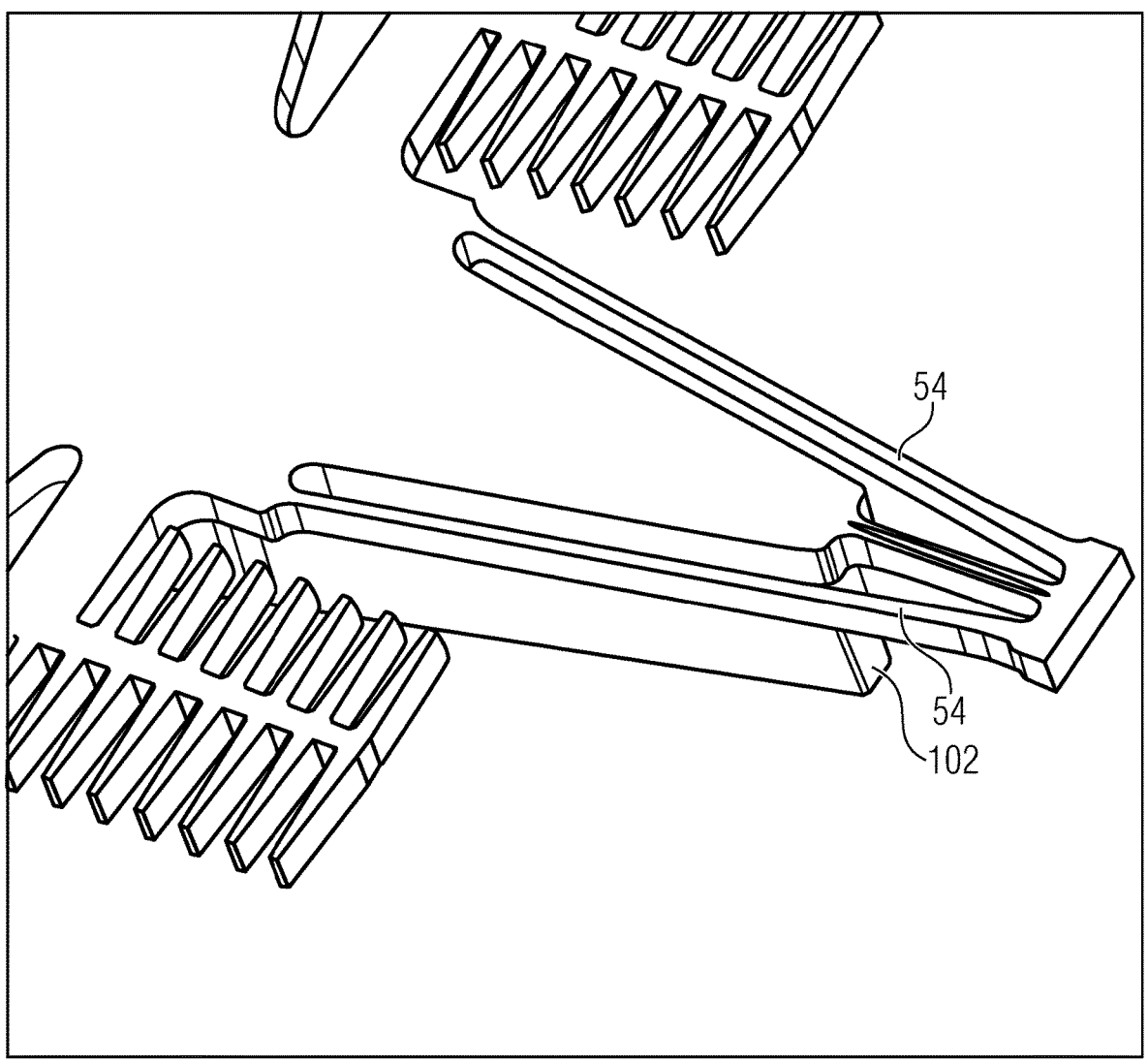
Figure 8A:
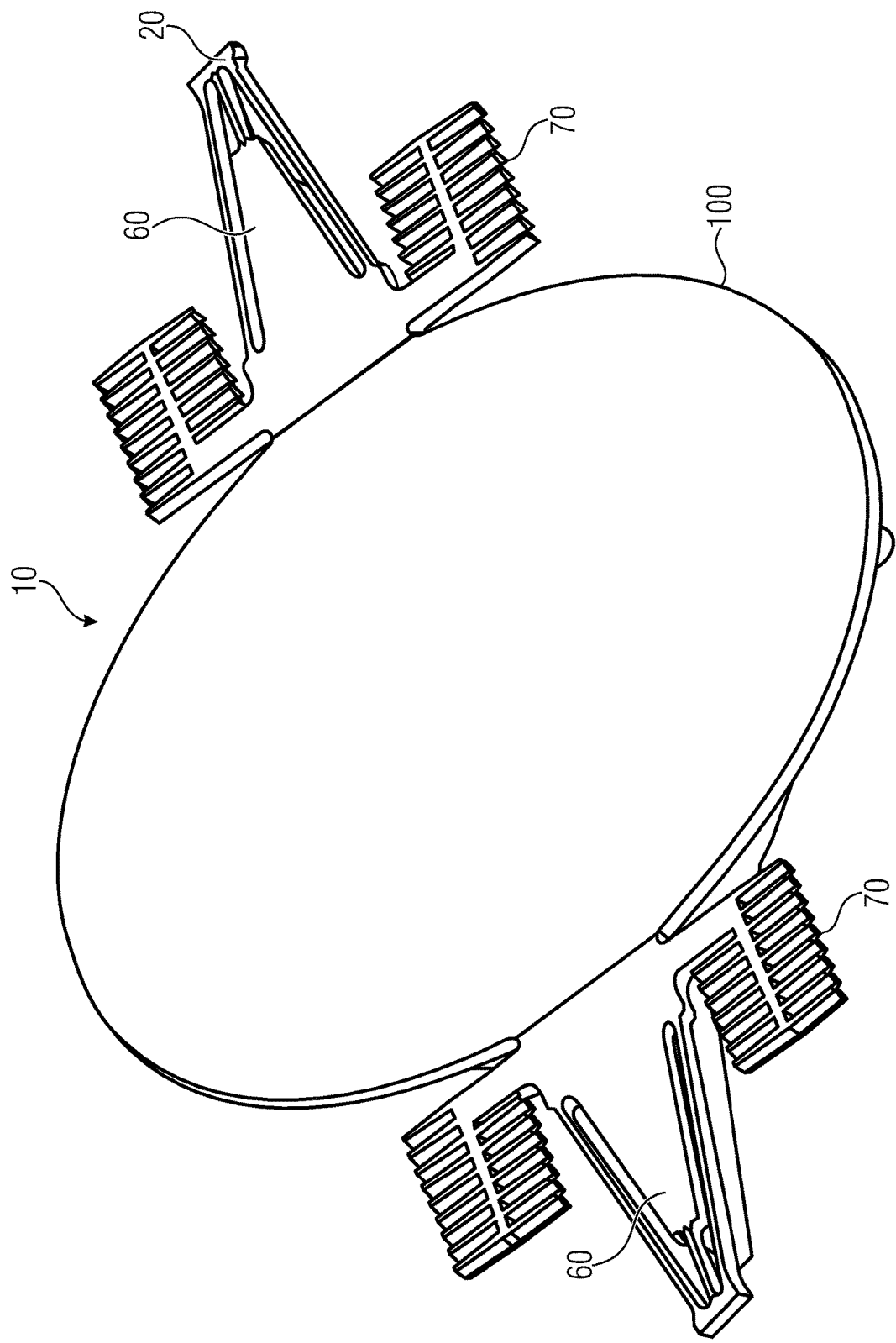
FIGS. 8A and 8B show a perspective top view and a perspective bottom view of the MEMS mirror device of FIGS. 6A and 6B.
Figure 8B:
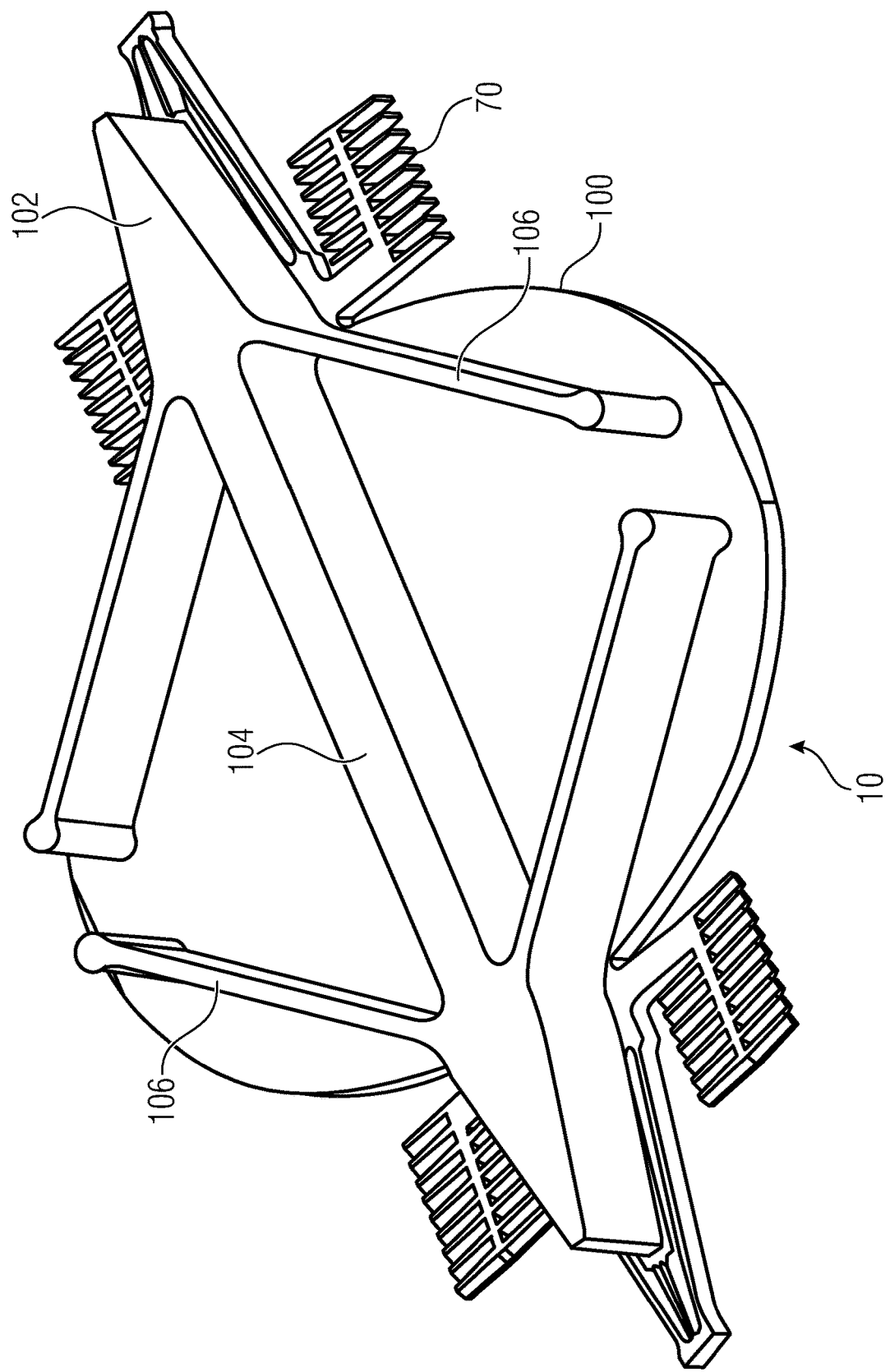

An example of a MEMS mirror device according to the present disclosure is now described referring to FIGS. 6 to 8, wherein FIGS. 6A and 6B show a schematic bottom view and a schematic side view of a MEMS mirror device, FIGS. 7A and 7B show a schematic bottom view and a perspective view of a suspension structure of the MEMS mirror device and FIGS. 8A and 8B show perspective top and bottom views of the MEMS mirror device.

The MEMS mirror device comprises a pivoting mirror body 10, two suspension structures 30 and a support 20. In some of the Figures, support 20 is shown as an anchor, but it is to be understood that the anchor may be part of a support structure, such as a support frame formed in a substrate. Mirror body 10 is coupled to support 20 via suspension structures 30 at opposite sides thereof along the pivot axis A.

Mirror body 10 comprises a mirror 100 and a mirror carrier 102, wherein the mirror carrier 12 is best shown in FIG. 8B. The MEMS mirror device may further comprise a frame (not shown in FIGS. 6 to 8), wherein the mirror body and the frame may be formed in a substrate and wherein the mirror body may be arranged in the frame. The substrate (or the frame) may define a plane, i.e. the (x, y) plane in FIG. 6A. The plane defined by the substrate may be parallel to planes defined by main surfaces of the substrate. The substrate may comprise a plurality of layers in which the mirror body, the suspension structures and the frame are formed.

The mirror body 10 is rotatable around pivot axis A. Pivot axis A extends in parallel to the substrate plane. As can be best seen in FIGS. 8A and 8B, mirror carrier 102 may include a longitudinal support bar 104 extending along the pivot axis A. Support bar 104 may protrude from the mirror 100 on both sides thereof in the direction of the pivot axis A. Portions of support bar 104 protruding from mirror 100 extend under protrusions 60 of the mirror body. Moreover, the mirror carrier 102 may include reinforcement beams 106. A first pair of reinforcement beams 106 may extend from a first end-portion of the mirror 100 in mutually opposite directions away from the pivot axis A. A second pair of reinforcement beams 106 may extend from an opposite second end-portion of the mirror 100 in mutually opposite directions away from the pivot axis A. The reinforcement beams 106 of the first pair may extend towards respective ones of the second pair.

The mirror 100 may be formed on the mirror carrier 102. In another example, the mirror 100 may be attached to the mirror carrier 102. The face of the mirror 10 opposite to mirror carrier 102 defines a mirror plane of the mirror 100. Those skilled in the art will appreciate that the shape of the mirror 100 and the mirror carrier 102 are independent and can be any shape desired for a particular application, e.g., a circle, ellipse, square, rectangle or other shape as desired.

The MEMS mirror device may also include at least one actuator to provide a torque to drive mirror body 10 about pivot axis A. In one example, the actuator may include mirror comb drive structures 70 attached to the mirror body 10. The mirror comb drive structures 70 may be interleaved with support comb drive structures attached to the support, such as a frame supporting the pivoting mirror body. Applying a difference in electrical potential between interleaved mirror comb drive structures and support comb drive structures may create a driving force between the mirror comb drive structures and the support comb drive structures, which may create a torque on the mirror body 10 about pivot axis A. An oscillating electrical potential can be applied to drive the mirror device at its natural frequency. In other examples, actuation methods may include electromagnetic actuation and piezoelectric actuation.

As it is best shown in FIGS. 7A and 7B, each of the suspension structures 30 comprises a torsion element 150 and first and second spring elements 52, 54. In the present example, the torsion element comprises two torsion bars 150a and 150b extending parallel to each other. First ends of torsion bars 150a, 150b are mechanically coupled to protrusion 60. Second ends of torsion bars 150a, 150b are mechanically coupled to support 20. Torsion bars 150a, 150b extend in parallel to pivot axis A. As explained in detail above, spring elements 52, 54 extend with an angle relative to pivot axis A to form a V spring.

As shown in FIG. 6B, the structures of mirror body 10 may be formed in a substrate comprising a stack of layers. A first sub-stack 160 and a second sub-stack 162 are shown in FIG. 6B. All structures except for mirror carrier 102 are formed in the first sub-stack and the mirror carrier 102 is formed in the second sub-stack. Each of the sub-stacks 160 and 162 may be formed by one or several material layers. In examples, the first sub-stack 160 may comprise two silicon layers and a dielectric layer, such as oxide, between the silicon layers. All structures of the mirror body except for the mirror carrier (stiffening structure) are formed in the same layers of sub-stack 160. In examples, the second sub-stack 162 may include a single silicon layer, in which mirror carrier 102 is formed.

In examples, structures of the support 20 may be formed in the same substrate as the mirror body. In examples, the support 20 may comprise a support frame. The support frame may define a mirror recess in which the mirror body 10 is arranged. The mirror recess may be defined by a recess periphery of the support frame.

In the example shown, torsion element 150 comprises two torsion bars. Making use of two torsion bars instead of one torsion bar of the same width permits stiffness of the torsion element to be doubled, particularly, but not only for the unwanted modes Tz and Ry, while the stress with respect to rotation about the pivot axis (mode Rx) in the individual torsion bars is not substantially increased and, in particular, is not doubled. Thus, an increased stiffness with respect to the unwanted translational mode Tz and the unwanted rotary mode Ry can be obtained without substantially stiffening the structure with respect to a rotation about the pivot axis (wanted mode Rx) because its Rx stiffness is dominated by the V springs. In other examples, the torsion elements may comprise a different number of torsion bars, such as three or four. Short narrow torsion bars in parallel are much stiffer with respect to bending in the z direction than for torsion.

Thus, adding short narrow torsion bars may suppress the Tz and Ry modes while hardly affecting mode Rx as explained above.

Figure 17:
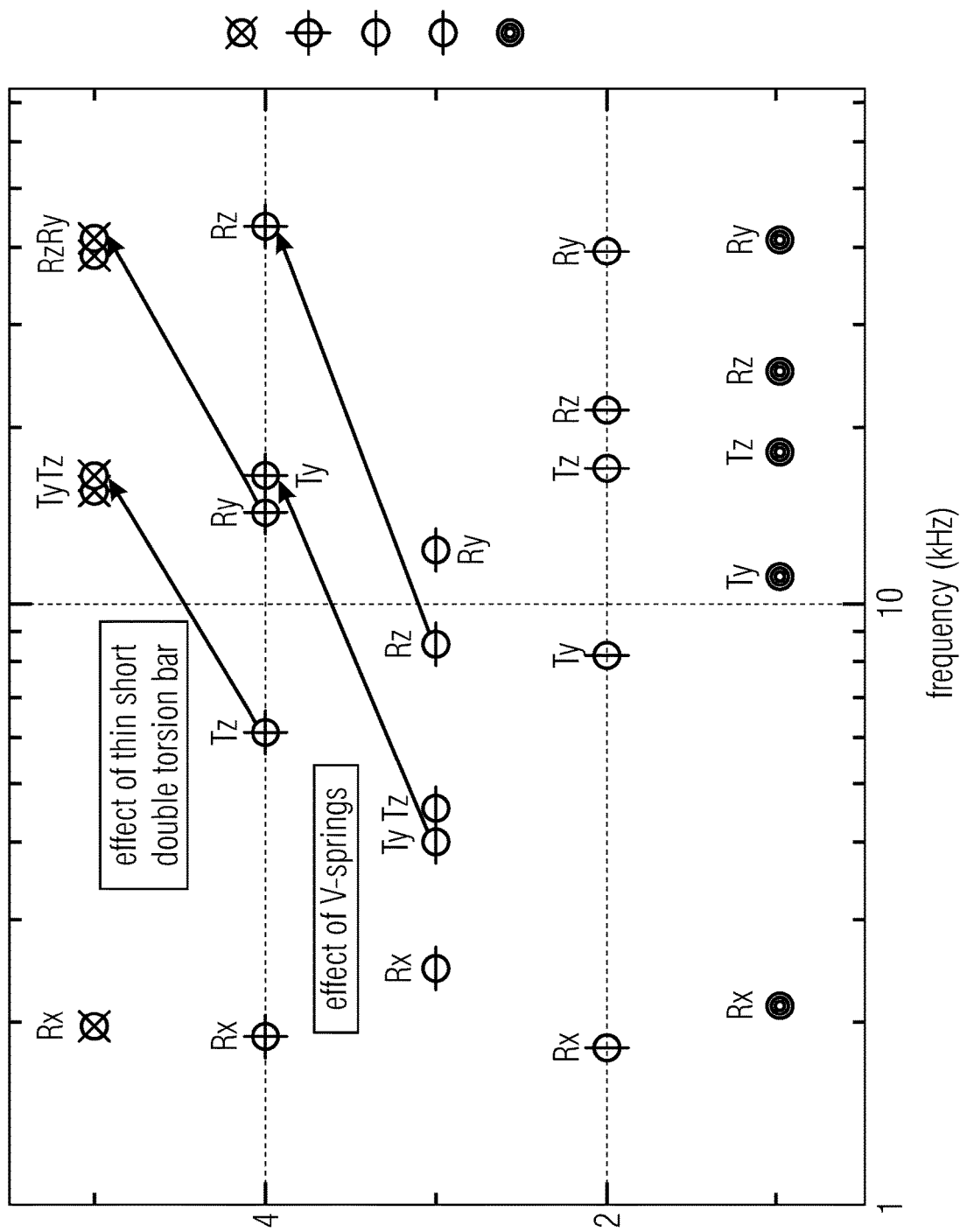
FIG. 17 shows a mode separation plot showing mode separation of an example of the present disclosure.

FIG. 17 shows a mode separation plot showing mode separation achieved by the example of the present disclosure described above with respect to FIGS. 6 to 8. FIG. 17 shows mode separation over the frequency in kHz, wherein the first and second line from the bottom show mode separation of known approaches using leaf springs, the third line from the bottom shows mode separation in case of torsion bars without V springs, the fourth line from the bottom shows mode separation in case of V springs without torsion bars, and the top line shows mode separation in case of V springs and short narrow torsion bars. It can be seen that examples of the present disclosure permit a considerably better separation between Rx mode and Rz mode as known leaf spring designs. Separation can be further optimized by adjustment of the mass distribution of the pivoting body.

Simulations showed that such improved mode separation can be achieved without increasing the stress in the torsion bars and the V springs at a maximum angle of deflection when compared to the stress values in known approaches using leaf springs. In particular, stress singularities due to reentrant corners at the ends of the leaf spring (leaf spring base and leaf spring head) do not appear according to approaches described herein. Herein, a reentrant corner means a sharp corner with an angle spanning more than 180° within the material forming the MEMS device. Thus, reliability may be increased.

Examples of the present disclosure permit a simplified processing and handling since no additional processing of thin layers for generating leaf springs is required. Furthermore, unlike leaf spring approaches, there are no stress singularities due to 90° reentrant corners. In addition, examples permit a better mode separation when compared to mode separation obtainable with leaf spring approaches.

Alternative examples of suspension structures are now described referring to FIGS. 9 to 15. In the following, differences between the respective suspension structures are outlined and a repetition of similar or identical features is omitted.

In the example shown in FIG. 7A, the second ends of the parallel torsion bars 150a and 150b and the spring bars 52, 54 forming a V spring are fixed to the support 20, such as a support frame. In the example shown in FIG. 9, parallel torsion bars 150a, 150b and spring bars 52, 54 forming a V spring are fixed to an anchor 172 and the anchor 172 is mechanically coupled to a support 20, such as a support frame, via a relief link 174. The relief link 174 may comprise a number of relief spring bars extending substantially perpendicular to the pivot axis A. First ends of the relief spring bars are fixed to anchor 172 and second ends of the relief spring bars are fixed to support 20. The relief link 174 is configured to allow for a translation of the ends of torsion bars 150a, 150b and spring bars 52, 54, which are close to the support in the x direction. Thus, the relief link 174 is to compensate for strain, such as thermal strain, in the x direction. To be more specific, the relief link may be configured to compensate for thermal strain effects, e.g. elongation of the mirror body due to temperature differences, which might otherwise result in buckling. It can also compensate for external stress from forces acting on the frame and also prevent buckling in such a situation.

Figure 9:
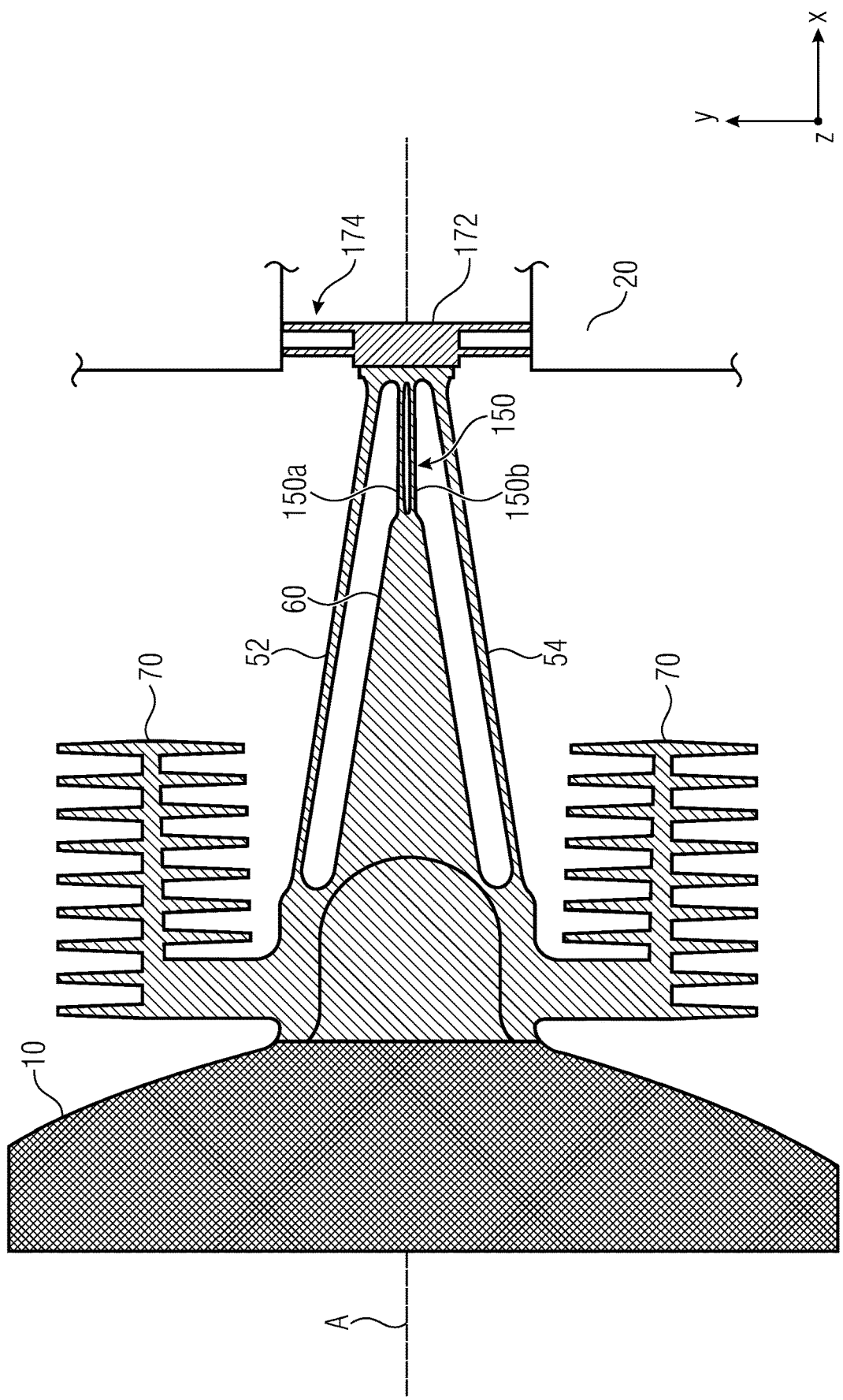
FIGS. 9 to 14, 15A and 15B show schematic top views of examples of suspension structures according to the present disclosure.
Figure 10:
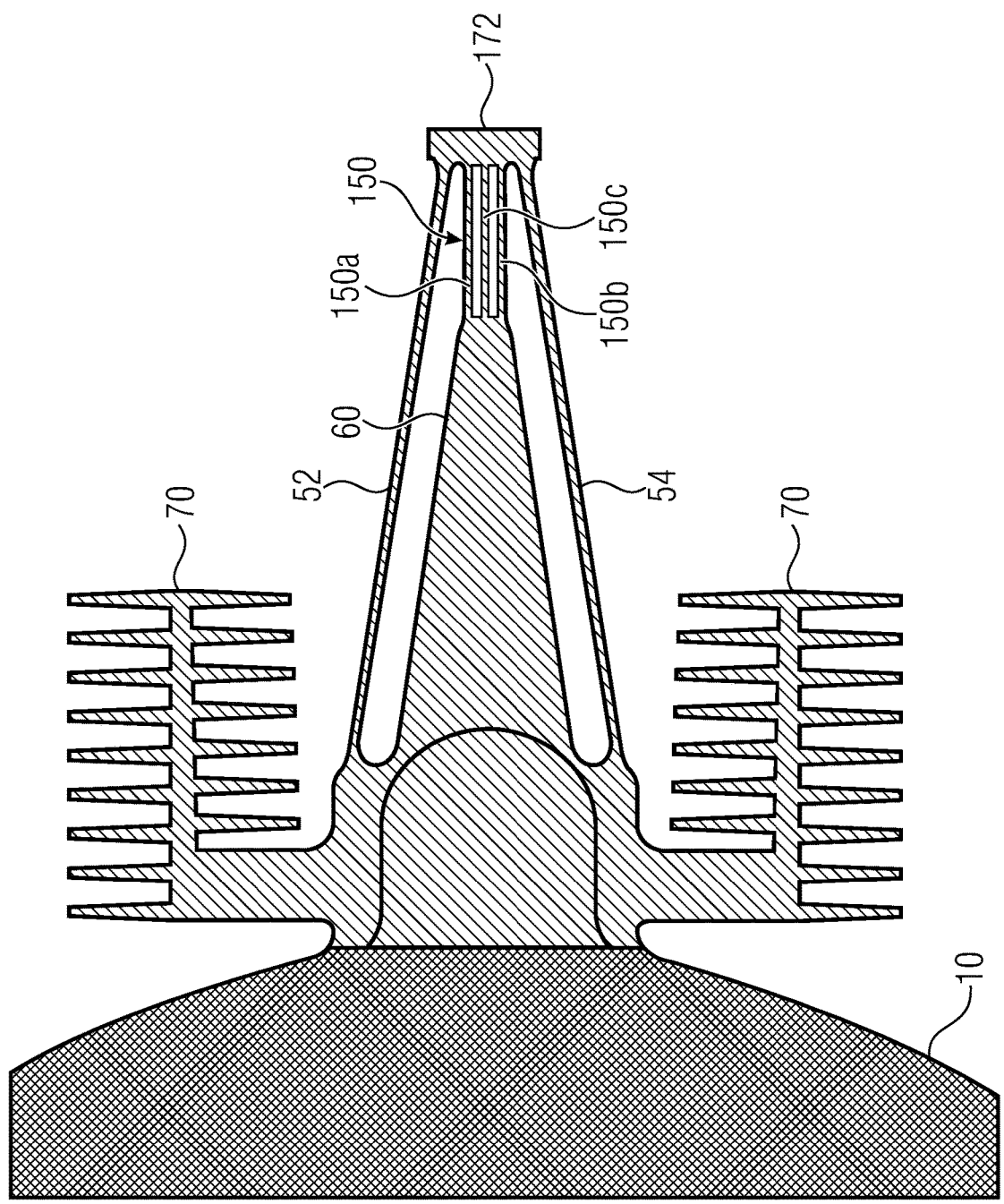

FIG. 10 shows an example of a suspension structure comprising a torsion element 150, which comprises three torsion bars 150a, 150b, 150c, which are arranged parallel to each other. As shown, the torsion bars 150a, 150b, 150c and the spring bars 52, 54 are fixed to an anchor 172. The anchor 172 may be fixed to a support or may be part of a support. Alternatively, the anchor 172 may be coupled to a support via a relief link as shown in FIG. 9.

Figure 11:
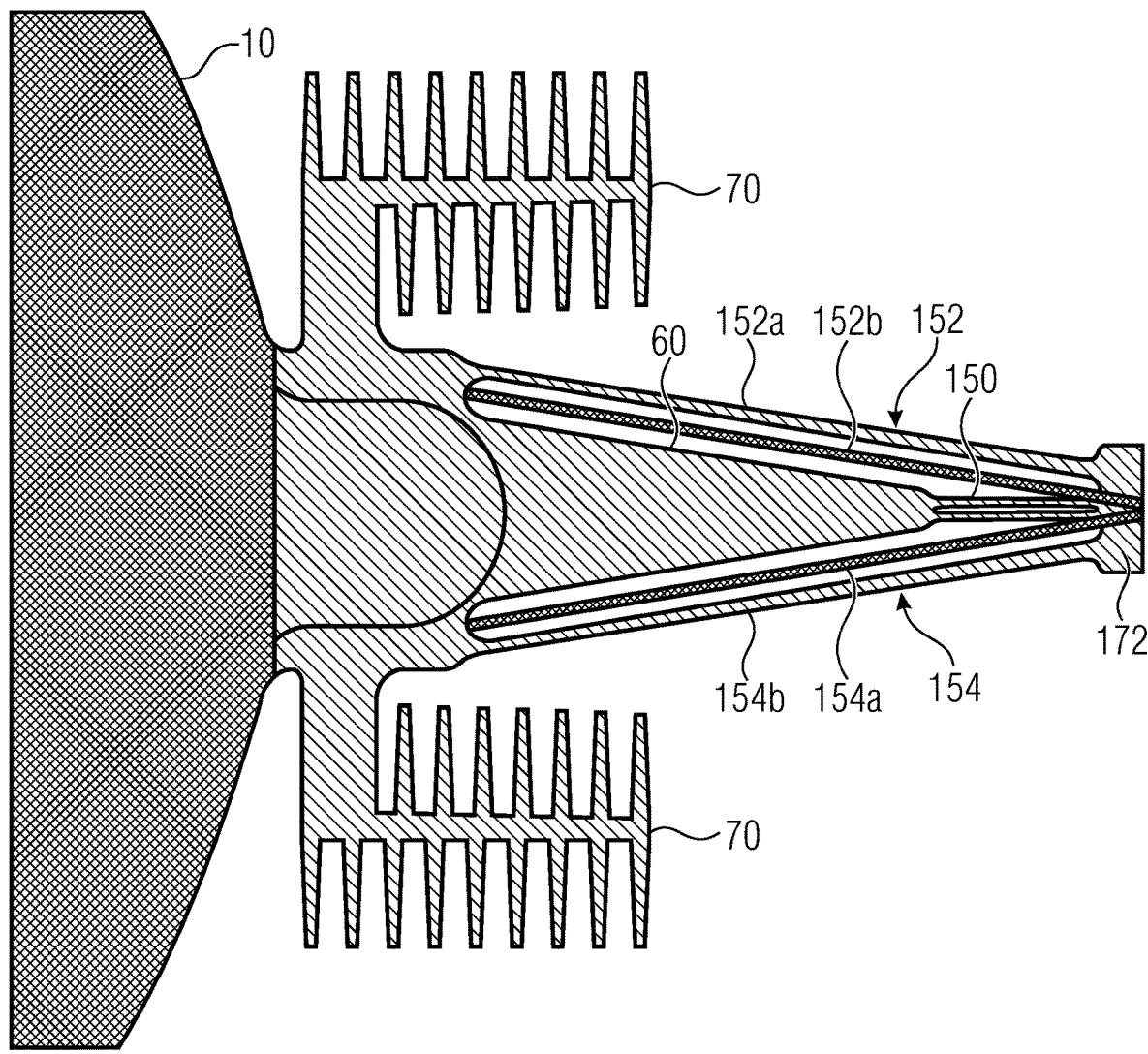

FIG. 11 shows an example of a suspension structure comprising the torsion element 150 with two torsion bars and comprising spring elements 152 and 154, each comprising first and second spring bars 152a, 152b and 154a, 154b, respectively. The respective first and second spring bars are arranged parallel to each other. Thus, the spring bars may be regarded as being arranged in a double V arrangement where the spring bars 152a, 154b form a first V and the spring bars 154a, 152b form a second V. Suppression of unwanted Ty and Rz modes may be improved using spring elements including a plurality of spring bars, which may be arranged parallel to each other. In addition, a double V spring design can approximately double the restoring torque for the Rx mode without significant increase in mechanical stress in an individual spring bar.

FIGS. 12 to 15 show different examples as to how mechanically coupling of suspension structures to the body and the support may be achieved.

Figure 12:
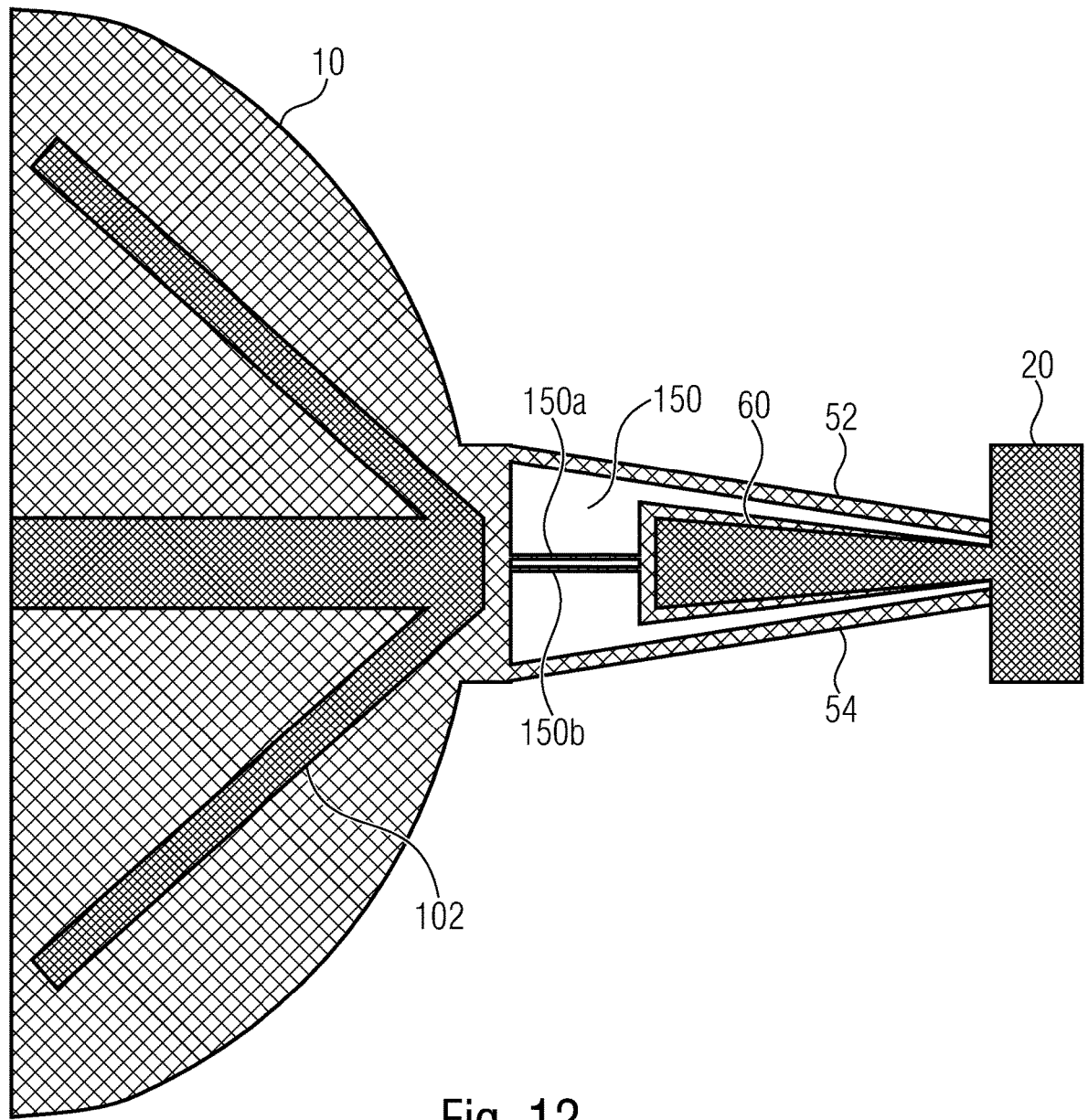

According to FIG. 12, support 20 comprises a protrusion 62, which second ends of torsion bars 150a and 150b are mechanically coupled to. The first ends of torsion bars 150a and 150b are coupled to body 10. Thus, in this example, the torsion element 150 is arranged closer to body 10 than to support 20. Protrusion 62 of support 20 may be formed in the same substrate layers in which pivoting body 10 is formed. Similar to protrusion 60 described above the shape of protrusion 62 may change in the direction of the pivot axis. As shown in FIG. 12, the width of the protrusion 62 may increase continuously towards the mirror.

Figure 13:
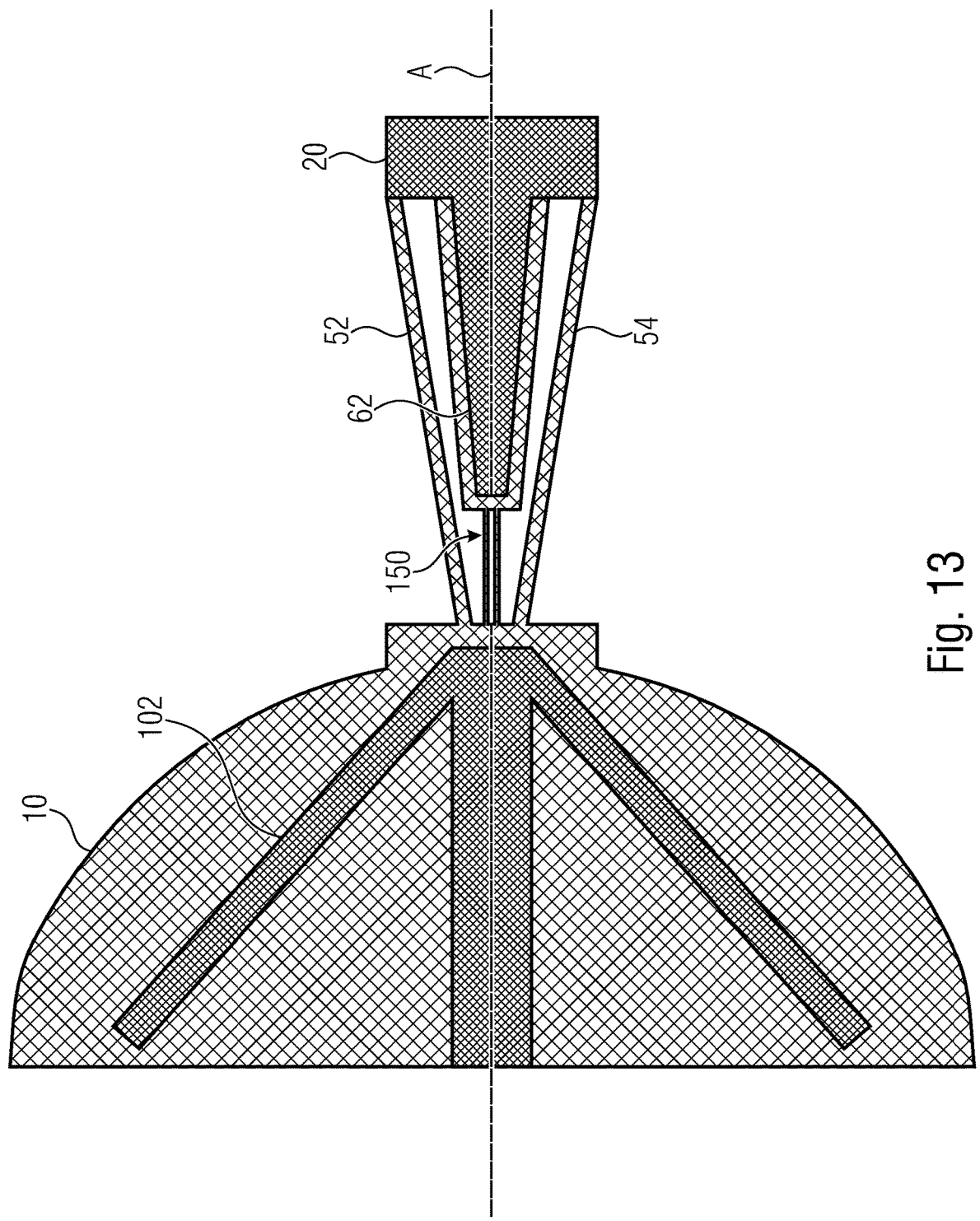

According to FIG. 13, spring bars 52 and 54 are arranged such that a distance between portions thereof closer to body 10 is less than a distance between portions thereof closer to support 20. Here, the V-shape of the springs opens towards the support 20. Such an arrangement might still provide an improved suppression or separation of unwanted modes but may result in an increased stiffness with respect to a rotation about the pivot axis A. As shown in FIG. 13, the width of the protrusion 62 may in this embodiment decrease continuously towards the mirror.

Figure 14:
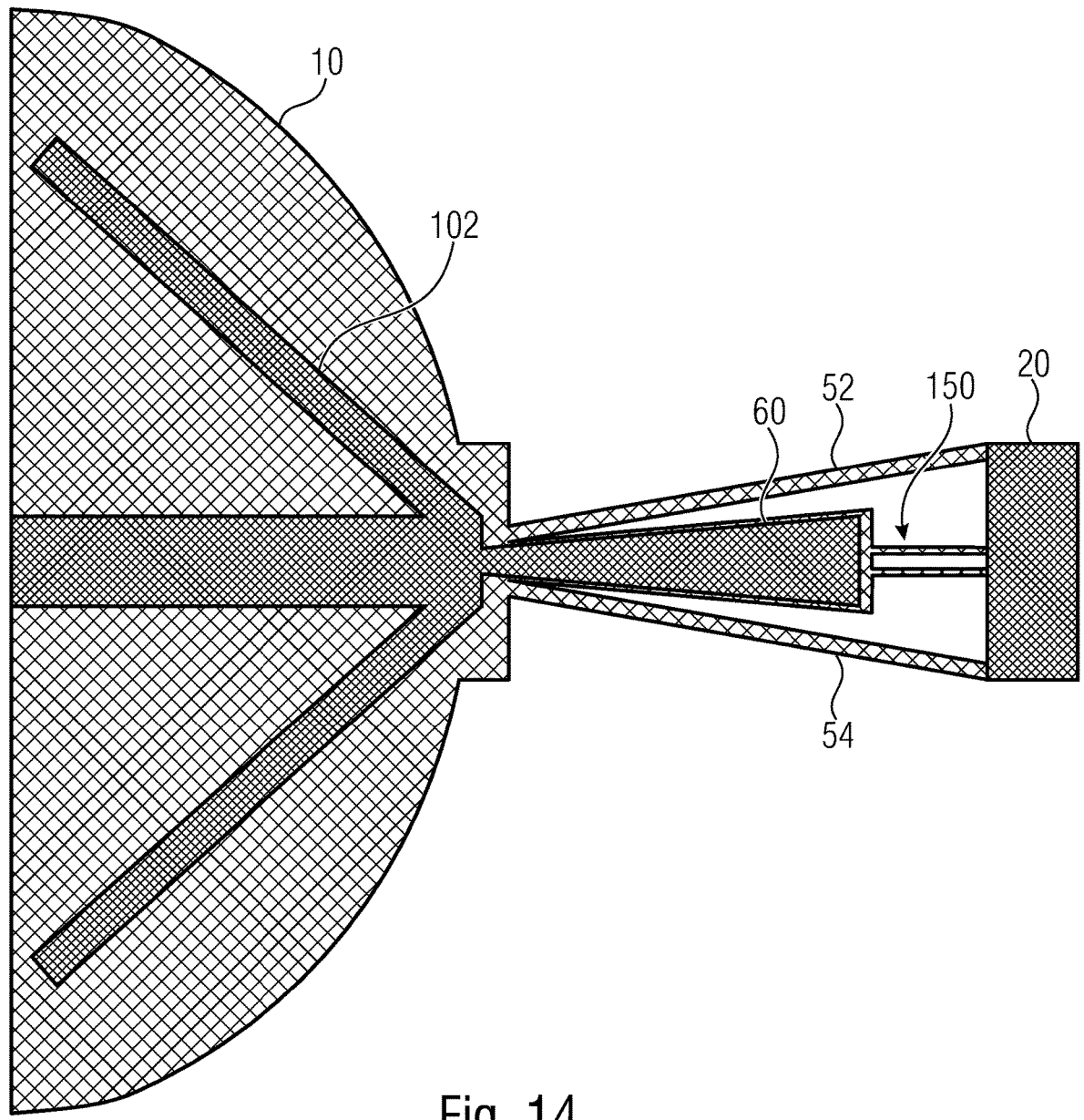

According to FIG. 14, spring bars 52 and 54 are also arranged such that a distance between portions thereof closer to body 10 is less than a distance between portions thereof closer to support 20. However, when compared to FIG. 13, protrusion 60 is now formed at pivoting body 10 so that torsion element 150 is arranged closer to support 20 than to pivoting body 10.

In examples, protrusions extending between the spring elements may be formed at both the pivoting body 10 and the support 20. In such examples the torsion element by be arranged between the pivoting body and the support with the same distance from the pivoting body and from the support.

Figure 15A:
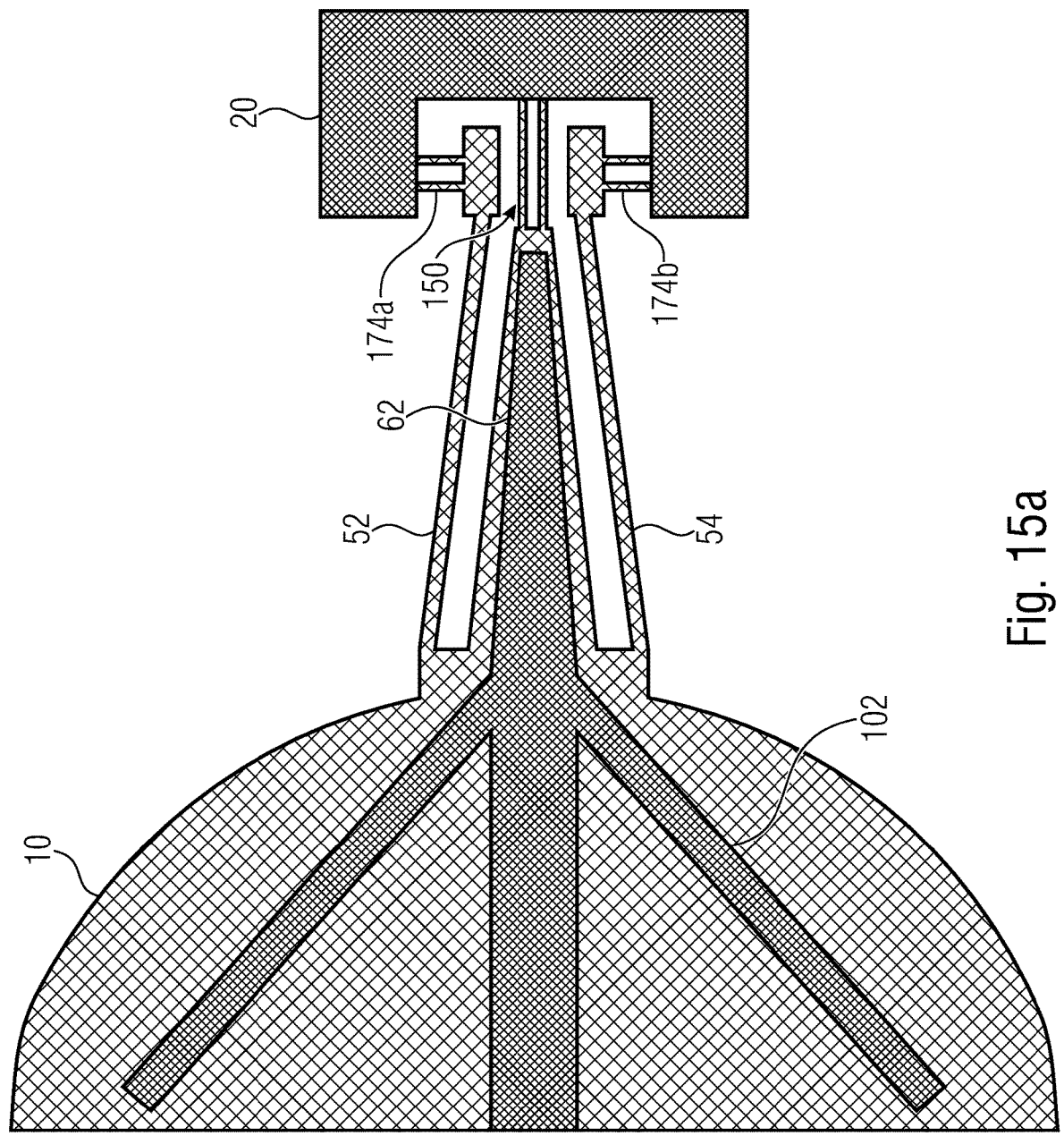

FIG. 15A shows an example similar to the example shown in FIG. 9. However, in the example shown in FIG. 15A, the torsion element 150, i.e. both torsion bars thereof, are fixed to support 20, and spring elements 52 and 54 are coupled to support 20 via a respective relief link 174a, 174b. In this example, the V springs are decoupled from the support by relief links such as to prevent buckling due to thermal expansion. Providing relief links for the V springs may be sufficient in case the torsion element, such as short narrow torsion bars 150a, 150b, 150c, are not expected to lead to considerable buckling. Avoiding the decoupling of the torsion element using a relief link may be effective to better suppress the unwanted Tx mode.

Figure 15B:
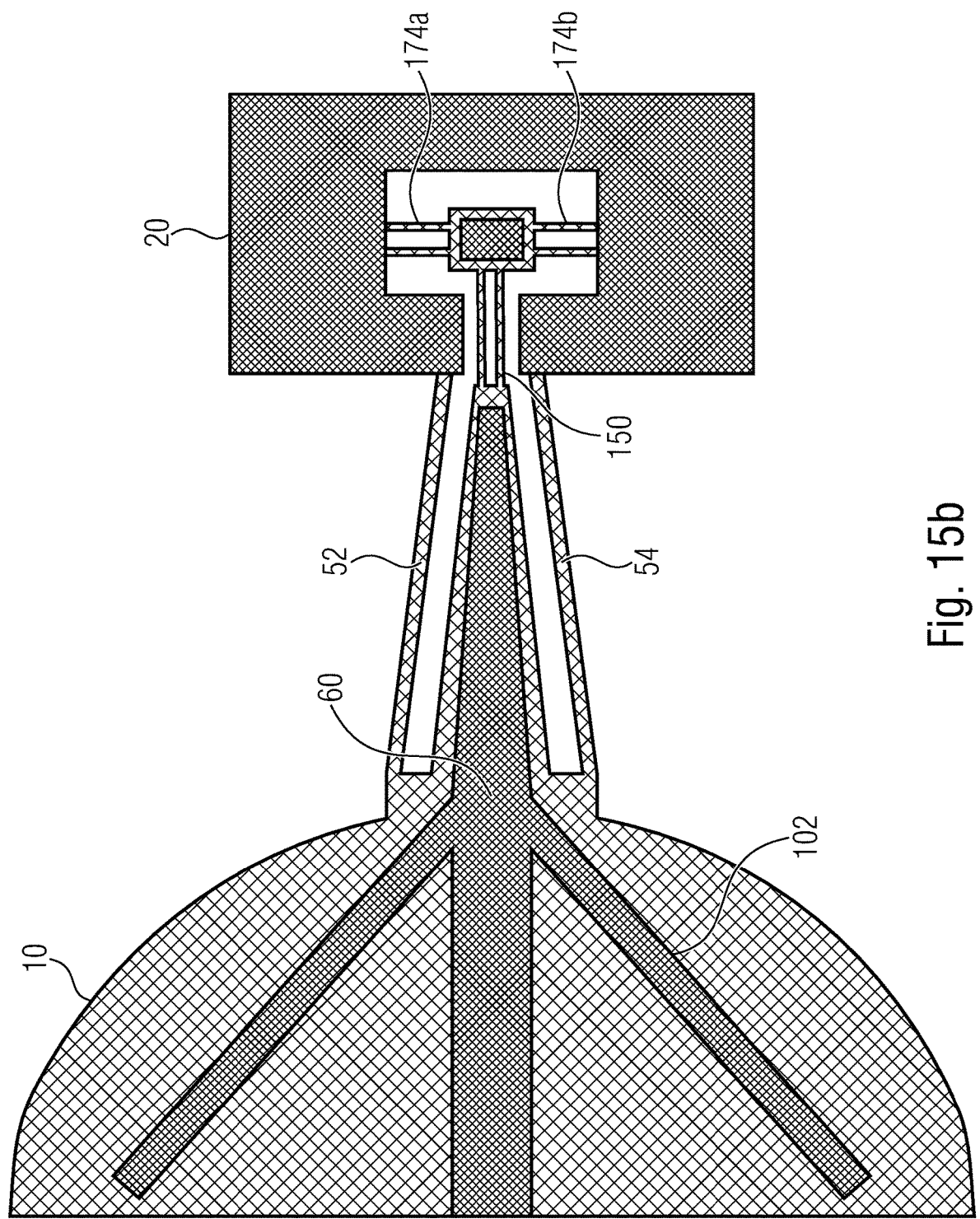

FIG. 15B shows an example similar to the example shown in FIGS. 9 and 15A. However, in the example shown in FIG. 15B, spring elements 52 and 54 are fixed to support 20, and the torsion element 150, i.e. both torsion bars thereof, are coupled to support 20 via a relief link 174a, 174b. In this example, the torsion element is decoupled from the support by the relief link. This may be desirable in situations where a strong influence of external forces on the mirror dynamics via the V springs is not expected, but where the torsion element is to be protected from such forces.

Different examples of suspension structures have been described. It is clear for those skilled in the art that the features of the different examples can be combined in any manner. Merely as an example, a different number of torsion bars and spring bars may be provided in the example of FIGS. 15A and 15B as well as in other examples, such as one or three torsion bars as shown in FIGS. 5C and 10 or two spring bars per spring element as shown in FIG. 11.

Relief links as described above may be provided at the suspension structure on one side of the pivoting body or may be provided at the suspension structures on both sides of the pivoting body.

Examples of the present disclosure may result in an improved mode separation and, therefore, mechanical robustness, in particular in cases where a device is operated in a system, which is subject to external vibrations, such as in case of an automotive environment. Examples of the present disclosure provide for a spring design for a MEMS device, such as a MEMS micromirror device, which is operated at resonance of a rotational degree of freedom. The spring design provides means to suppress all other rigid body modes of the pivoting body, such as the mirror. This is enabled by a combination of V springs and short narrow torsion bars, which all may have the same out-of-plane (z direction) thickness. In addition, in examples, the spring design may be combined with springs providing relief in x direction and which can thus compensate for thermal strain and/or external stress.

Simulation of the spring design by means of finite element analysis showed that examples, in particular examples comprising a torsion element with two narrow short torsion bars, may result in better mode separation than a reference leaf spring design. This was achieved without unfavorably affecting other behavior, such as dynamic deformation, stiffening curve, dynamic response curves, and stress distribution.

In addition, leaf spring approaches require generally the formation of a thin membrane layer, such as of 10 μm thickness, to realize the leaf spring in a manufacturing process flow. The formation of thin membranes in the membrane layer spanning area regions in a substrate plane of typically several hundreds of micrometers and up to millimeters imply a very delicate and error-prone handling. Such membranes may crack during processing. Particularly, these membranes may hermetically seal cavities within a material layer stack during the process flow when the MEMS device is not completely structured yet. Pressure differences between such sealed cavities beneath the membranes and outside pressure occur regularly in processing chambers and will result in strong mechanical stress in the membranes, which can lead ultimately to cracking. Since examples of the present disclosure do not require such membranes simplified processing and handling is possible and manufacturing may be more reliable. Generally, the formation of leaf springs requires at least one additional layer in the processing technology compared to examples of the present disclosure. Apart from the issue of handling sealed cavities, this additional layer may lead to additional processing difficulties, such as the necessity to perform wafer-bonding on pre-structured wafer surfaces and the necessity to perform multiple deep reactive-ion etching (DRIE) steps subsequently for different layers on the same wafer side. Bonding on pre-structured surfaces may compromise bond quality compared to bonding unstructured surfaces and multiple DRIE steps on the same wafer side involve the risk of later DRIE steps damaging the etching side walls formed in previous DRIE steps. With such processing needs, it is generally challenging to achieve a reliable manufacturing flow.

Moreover, the formation of a thin membrane layer in a leaf spring approach generally requires that means to form its thickness in a controlled manner need to be implemented. For example, it could be required that its thickness shall not vary by more than 3%. Such a requirement may be met by forming the thin membrane layer in the device layer of a first silicon-on-insulator (SOI) wafer. However, at least one additional (second) SOI wafer is then required to provide the two thicknesses for the layers, in which the other features, such as comb drives, torsion bars, the mirror body, and the stiffening structures are formed. Hereby, the two discrete thicknesses are provided by the device layer and the handle layer, respectively, of the second SOI wafer. Thus, two SOI wafers can be required to process a leaf spring design in a controlled manner. Since examples of the present disclosure do not use leaf springs, examples of the present disclosure may be manufactured using only one SOI wafer. This may reduce raw materials costs significantly because SOI wafers are expensive.

In addition, the occurrence of reentrant corners at mechanically stressed locations, which lead to uncontrolled mechanical stress conditions, are avoided with the design approach set forth by examples of the present disclosure. Such locations appear in leaf spring designs, where the thin leaf springs are coupled to other elements, such as anchor elements, connecting elements, or body support elements, which are formed with considerably higher thickness.

Examples of the present disclosure provide methods for manufacturing such MEMS devices.

As shown in FIG. 16A, in examples, the method comprises forming 200 in a substrate a body pivoting around a pivot axis, a support and a suspension structure mechanically coupling the body to the support. Forming the suspension structure comprises forming 202 a torsion element defining the pivot axis, and first and second spring elements extending with an angle relative to the pivot axis on opposing sides of the torsion element so that a distance between at least portions of the first and second spring elements is changing in the direction of the pivot axis. The extension of the first and second spring elements in the direction of the pivot axis is larger than the extension of the torsion element in the pivot axis.

As shown in FIG. 16B, in examples, the method comprises forming 210 in a substrate a body pivoting around a pivot axis, a support and a suspension structure mechanically coupling the body to the support. Forming the suspension structure comprises forming 212 a torsion element defining the pivot axis, and first and second spring elements extending with an angle relative to the pivot axis on opposing sides of the torsion element so that a distance between at least portions of the first and second spring elements is changing in the direction of the pivot axis. A relief link mechanically coupling at least the first and second spring elements or the torsion element to the support is formed 214, wherein the relief link is configured to allow for a translation of at least the first and second spring elements or the torsion element in the direction of the pivot axis at their ends adjacent to the relief link.

As shown in FIG. 16C, in examples, the method comprises forming 220 in a substrate a body pivoting around a pivot axis, a support and a suspension structure mechanically coupling the body to the support. Forming the suspension structure comprises forming 222 a torsion element defining the pivot axis, and first and second spring elements extending with an angle relative to the pivot axis on opposing sides of the torsion element so that a distance between at least portions of the first and second spring elements is changing in the direction of the pivot axis. The torsion element and the first and second spring elements are formed in the same material layer or in the same material layers of a material layer stack. Thus, manufacturing of the MEMS device may be simplified when compared to other designs, such as designs using leaf springs.

In examples, the MEMS device may be formed using at least one SOI wafer. In other examples, the MEMS device may be formed using a wafer different from a SOI wafer, which may comprise a semiconductor layer having a doping implant, an epitaxial layer or an isolated polysilicon layer at one surface thereof so that electrically separable regions in a comb drive may be formed. In such examples, raw material costs and reliability may be further improved.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus, the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims Such combinations are proposed herein unless it is stated that a specific combination is not intended. Furthermore, it is intended to include also features of a claim to any other independent claim even if this claim is not directly made dependent to the independent claim.

The above described examples are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

What is claimed is:

1. A Micro Electro Mechanical System (MEMS) device, comprising:
a body configured to pivot around a pivot axis;
a support;
a suspension structure mechanically coupling the body to the support,
wherein the suspension structure comprises a torsion element defining the pivot axis, and a first spring element and a second spring element having an extension extending with an angle relative to the pivot axis on opposing sides of the torsion element so that a distance between at least a portion of the first spring element and at least a portion of the second spring element changes in a direction of the pivot axis: and
a protrusion extending along the pivot axis between the body and the support, wherein the protrusion is coupled to the torsion bar at an intermediary point located on the pivot axis between the body and the support,
wherein the first spring element comprises a first end coupled to the body and a second end coupled to the support, the first spring element extending from the first end to the second end with the angle relative to the pivot axis,
wherein the second spring element comprises a third end coupled to the body and a fourth end coupled to the support, the second spring element extending from the third end to the fourth end with the angle relative to the pivot axis,
wherein the intermediary point is located between the first end and the second end in the direction of the pivot axis and between the third end and the fourth end in the direction of the pivot axis.

2. The MEMS device of claim 1, wherein the torsion element comprises at least one torsion bar, wherein each of the first and the second spring elements comprises at least one spring bar, and wherein a minimum width of the torsion bar in a direction perpendicular to a longitudinal direction thereof is less than a minimum width of each spring bar in a direction perpendicular to a longitudinal direction thereof.

3. The MEMS device of claim 1, wherein the body comprises the protrusion, wherein the protrusion extends from the body towards the torsion element along the pivot axis and is coupled to the torsion element, wherein the protrusion is interposed between the first and the second spring elements in a direction perpendicular to the pivot axis.

4. The MEMS device of claim 1, wherein the support comprises the protrusion, wherein the protrusion extends from the support towards the torsion element along the pivot axis and is coupled to the torsion element, wherein the protrusion is interposed between the first and the second spring elements in a direction perpendicular to the pivot axis.

5. The MEMS device of claim 1, wherein the suspension structure is formed symmetrically with respect to the pivot axis.

6. The MEMS device of claim 1, wherein the suspension structure is arranged at a first end of the body and the MEMS device further comprises a further suspension structure arranged at a second end of the body.

7. The MEMS device of claim 6, wherein the suspension structure and the further suspension structure are symmetrical with respect to a plane perpendicular to the pivot axis.

8. The MEMS device of claim 1, wherein the body and the suspension structure are configured such that translation oscillations in directions perpendicular and parallel to the pivot axis and rotational oscillations about axes perpendicular to the pivot axis comprise resonant frequencies which are different from harmonic frequencies of a resonant frequency of a rotational oscillation around the pivot axis.

9. The MEMS device of claim 1, wherein the body is a mirror body comprising a mirror and a comb drive structure.

10. The MEMS device of claim 9, wherein the mirror body comprises a stiffening structure configured to stiffen the mirror and a protrusion to which the torsion element is mechanically coupled.

11. The MEMS device of claim 10, wherein the stiffening structure comprises a first support structure and a second support structure coupled to the suspension structure, wherein the first support structure and a second support structure extend at diverging angles in mutually opposite directions away from the pivot axis.

12. The MEMS device of claim 1, wherein the protrusion includes a first surface that extends between the body and the torsion element in parallel to the extension of the first spring element and a second surface that extends between the body and the torsion element in parallel to the extension of the second spring element.

13. The MEMS device of claim 1, wherein the torsion element spans a first portion of a distance between the body and the support in the direction of the pivot axis and the protrusion spans a second portion of the distance between the body and the support in the direction of the pivot axis.

14. The MEMS device of claim 1, wherein the torsion element extends from the support towards the protrusion in the direction of the pivot axis.

15. The MEMS device of claim 1, wherein the torsion element extends from the body towards the protrusion in the direction of the pivot axis.

16. A Micro Electro Mechanical System (MEMS) device, comprising:
a body configured to pivot around a pivot axis;
a support; and
a suspension structure mechanically coupling the body to the support,
wherein the suspension structure comprises a torsion element defining the pivot axis, and a first spring element and a second spring element having an extension extending with an angle relative to the pivot axis on opposing sides of the torsion element so that a distance between at least a portion of the first spring element and at least a portion of the second spring element changes in a direction of the pivot axis, and
wherein the extension of the first and the second spring elements in the direction of the pivot axis is larger than an extension of the torsion element in the direction of the pivot axis,
wherein the suspension structure comprises a relief link mechanically coupling at least one of the first and the second spring elements and the torsion element to the support, wherein the relief link is configured to allow for a translation of the at least one of the first and the second spring elements and the torsion element in the direction of the pivot axis at their ends adjacent to the relief link.

17. A Micro Electro Mechanical System (MEMS) device, comprising:
a body configured to pivot around a pivot axis;
a support; and
a suspension structure mechanically coupling the body to the support,
wherein the suspension structure comprises a torsion element defining the pivot axis, and a first spring element and a second spring element having an extension extending with an angle relative to the pivot axis on opposing sides of the torsion element so that a distance between at least a portion of the first spring element and at least a portion of the second spring element changes in a direction of the pivot axis, and
wherein the extension of the first and the second spring elements in the direction of the pivot axis is larger than an extension of the torsion element in the direction of the pivot axis,
wherein the torsion element comprises a plurality of torsion bars, and wherein each of the first and the second spring elements comprises a plurality of spring bars.

18. The MEMS device of claim 17, wherein the plurality of torsion bars extend parallel to each other, and wherein the plurality of spring bars extend parallel to each other.

19. A Micro Electro Mechanical System (MEMS) device, comprising:
a body configured to pivot around a pivot axis;
a support; and
a suspension structure mechanically coupling the body to the support,
wherein the suspension structure comprises a torsion element defining the pivot axis, and a first spring element and a second spring element having an extension extending with an angle relative to the pivot axis on opposing sides of the torsion element so that a distance between at least a portion of the first spring element and at least a portion of the second spring element changes in a direction of the pivot axis,
wherein the suspension structure comprises a relief link mechanically coupling at least one of the first and the second spring elements and the torsion element to the support, wherein the relief link is configured to allow for a translation of the at least one of the first and the second spring elements and the torsion element in the direction of the pivot axis at their ends adjacent to the relief link.

20. The MEMS device of claim 19, wherein the relief link mechanically couples the first and the second spring elements and the torsion element to the support, wherein the relief link is configured to allow for a translation of the first and the second spring elements and the torsion element in the direction of the pivot axis at their ends adjacent to the relief link.

21. A method for manufacturing a Micro Electro Mechanical System (MEMS) device, the method comprising:
forming, in a substrate, a body configured to pivot around a pivot axis, a support, and a suspension structure mechanically coupling the body to the support, wherein forming the suspension structure comprises:
forming a torsion element defining the pivot axis; and
forming a first spring element and a second spring element having an extension extending with an angle relative to the pivot axis on opposing sides of the torsion element so that a distance between at least a portion of the first spring element and at least a portion of the second spring element changes in a direction of the pivot axis; and
forming a protrusion that extends along the pivot axis between the body and the support, wherein the protrusion is coupled to the torsion bar at an intermediary point located on the pivot axis between the body and the support, wherein the torsion element spans a first portion of a distance between the body and the support along the pivot axis and the protrusion spans a second portion of the distance between the body and the support along the pivot axis.

22. A method for manufacturing a Micro Electro Mechanical System (MEMS) device, the method comprising:

forming, in a substrate, a body configured to pivot around a pivot axis, a support, and a suspension structure mechanically coupling the body to the support, wherein forming the suspension structure comprises:

forming a torsion element defining the pivot axis; and forming a first spring element and a second spring element having an extension extending with an angle relative to the pivot axis on opposing sides of the torsion element so that a distance between at least a portion of the first spring element and at least a portion of the second spring element changes in a direction of the pivot axis; and forming a relief link mechanically coupling at least one of the first and the second spring elements and the torsion element to the support, wherein the relief link is configured to allow for a translation of the at least one of the first and the second spring elements and the torsion element in the direction of the pivot axis at their ends adjacent to the relief link.

23. A method for manufacturing a Micro Electro Mechanical System (MEMS) device, the method comprising:

forming, in a substrate, a body configured to pivot around a pivot axis, a support, and a suspension structure mechanically coupling the body to the support, wherein forming the suspension structure comprises:

forming a torsion element defining the pivot axis; and forming a first spring element and a second spring element having an extension extending with an angle relative to the pivot axis on opposing sides of the torsion element so that a distance between at least a portion of the first spring element and at least a portion of the second spring element changes in a direction of the pivot axis, wherein the torsion element and the first and the second spring elements are formed in a same material layer, wherein the body is a mirror body, and the method further comprises:

forming a mirror and a comb drive of the mirror body in the same material layer as the first and the second spring elements and the torsion element; and forming a stiffening structure of the mirror body in a material layer different from the material layer or the material layers in which the first and the second spring elements and the torsion element are formed.

* * * * *